(12) United States Patent
Yang et al.

(10) Patent No.: US 12,538,681 B2
(45) Date of Patent: Jan. 27, 2026

(54) DISPLAY PANEL COMPRISING TRANSISTOR WITH TWO GATES

(71) Applicant: BOE TECHNOLOGY GROUP CO., LTD., Beijing (CN)

(72) Inventors: Wei Yang, Beijing (CN); Fengjuan Liu, Beijing (CN); Wei Liu, Beijing (CN); Ce Ning, Beijing (CN); Guangcai Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 602 days.

(21) Appl. No.: 17/914,415

(22) PCT Filed: Jun. 10, 2021

(86) PCT No.: PCT/CN2021/099477
§ 371 (c)(1),
(2) Date: Sep. 26, 2022

(87) PCT Pub. No.: WO2022/257081
PCT Pub. Date: Dec. 15, 2022

(65) Prior Publication Data
US 2024/0389414 A1 Nov. 21, 2024

(51) Int. Cl.
*H10K 59/131* (2023.01)
*G09G 3/3233* (2016.01)
(Continued)

(52) U.S. Cl.
CPC ....... *H10K 59/1315* (2023.02); *G09G 3/3233* (2013.01); *H10K 59/1201* (2023.02);
(Continued)

(58) Field of Classification Search
CPC ........... H10K 59/1315; H10K 59/1201; H10K 59/1213; H10K 59/124; G09G 3/3233;
(Continued)

(56) References Cited

U.S. PATENT DOCUMENTS

| 9,013,383 B2 | 4/2015 | Hough |
| 10,564,494 B2 | 2/2020 | Long et al. |

(Continued)

FOREIGN PATENT DOCUMENTS

| CN | 104752343 A | 7/2015 |
| CN | 104867870 A | 8/2015 |

(Continued)

OTHER PUBLICATIONS

Written Opinion from PCT/CN2021/099477 dated Mar. 9, 2022.
(Continued)

*Primary Examiner* — Tan N Tran
(74) *Attorney, Agent, or Firm* — Calfee, Halter & Griswold LLP

(57) ABSTRACT

A display panel includes base substrate, second conductive layer, second active layer, third gate insulating layer, third conductive layer in sequence. The second conductive layer includes first conductive part forming first gate of first transistor. The second active layer includes first active part including first and second sub-active parts and third sub-active part therebetween. The first and second sub-active parts form first and second electrodes of first transistor, and portion of the third sub-active part forms channel region of first transistor. Orthographic projection of the first conductive part on the base substrate covers that of the third sub-active part. Orthographic projection of the third gate insulating layer on the base substrate covers that of the first active part. The third conductive layer includes second conductive part forming second gate of first transistor. Orthographic projection of the second conductive part on the base substrate covers that of the channel region.

11 Claims, 18 Drawing Sheets

(51) Int. Cl.
*H10K 59/12* (2023.01)
*H10K 59/121* (2023.01)
*H10K 59/124* (2023.01)

(52) U.S. Cl.
CPC ....... *H10K 59/1213* (2023.02); *H10K 59/124* (2023.02); *G09G 2310/08* (2013.01)

(58) Field of Classification Search
CPC ....... G09G 2310/08; G09G 2300/0426; G09G 2300/0819; G09G 2300/0842; G09G 2300/0861; H10D 30/6734; H10D 30/6715; H10D 30/6755; H10D 86/423; H10D 86/441; H10D 86/481; H10D 86/60
See application file for complete search history.

(56) References Cited

U.S. PATENT DOCUMENTS

| | | | | |
|---|---|---|---|---|
| 11,217,696 | B2* | 1/2022 | Kim | H10D 30/6755 |
| 11,322,083 | B2* | 5/2022 | Nie | G09G 3/3233 |
| 12,142,675 | B2* | 11/2024 | Nanjo | H10D 30/015 |
| 2012/0280969 | A1 | 11/2012 | Hough | |
| 2017/0005152 | A1 | 1/2017 | Hong | |
| 2017/0047348 | A1 | 2/2017 | Abe | |
| 2018/0061863 | A1 | 3/2018 | Abe | |
| 2018/0203311 | A1 | 7/2018 | Long et al. | |
| 2022/0310731 | A1 | 9/2022 | Chen | |

FOREIGN PATENT DOCUMENTS

| | | |
|---|---|---|
| CN | 104867959 A | 8/2015 |
| CN | 104900654 A | 9/2015 |
| CN | 205665504 U | 10/2016 |
| CN | 106098784 A | 11/2016 |
| CN | 109817645 A | 5/2019 |
| CN | 110890387 A | 3/2020 |
| CN | 111710725 A | 9/2020 |
| CN | 112071268 A | 12/2020 |
| CN | 112133728 A | 12/2020 |
| CN | 112259610 A | 1/2021 |
| CN | 112597844 A | 4/2021 |
| CN | 112599540 A | 4/2021 |
| CN | 112634807 A | 4/2021 |
| CN | 112885850 A | 6/2021 |
| EP | 2504830 A1 | 10/2012 |
| EP | 2504830 B1 | 9/2017 |
| JP | H06333948 A | 12/1994 |
| JP | H07321329 A | 12/1995 |
| WO | 2011064578 A1 | 11/2010 |
| WO | 2021104150 A1 | 6/2021 |

OTHER PUBLICATIONS

International Search Report from PCT/CN2021/099477 dated Mar. 9, 2022.

Communication from European Application No. 21944590.5 dated Nov. 29, 2023.

* cited by examiner

DISPLAY PANEL COMPRISING TRANSISTOR WITH TWO GATES

CROSS-REFERENCE TO RELATED APPLICATIONS

This application is based upon International Application No. PCT/CN2021/099477 filed on Jun. 10, 2021, the entire contents thereof are incorporated herein by reference.

TECHNICAL FIELD

The present disclosure relates to the field of display technology, and in particular, to a display panel and a manufacturing method thereof, and a display device.

BACKGROUND

A display panel generally includes various circuits such as a pixel driving circuit and a gate driving circuit integrated on an array substrate. The various circuits integrated on the array substrate generally include transistors. In the related art, due to the manufacturing process and other reasons, the size of the transistor cannot be meet a preset requirement.

It should be noted that the information disclosed in the above background section is only for enhancement of understanding of the background of the present disclosure, and therefore may contain information that does not form the prior art that is already known to a person skilled in the art.

SUMMARY

An aspect of the present disclosure provides a display panel including a first transistor, wherein the display panel includes:
a base substrate;
a second conductive layer, located on a surface of the base substrate and including a first conductive part, the first conductive part being provided to form a first gate of the first transistor;
a second active layer, located on a surface of the second conductive layer away from the base substrate and including a first active part, the first active part including a first sub-active part, a second sub-active part, and a third sub-active part connected between the first sub-active part and the second sub-active part, the first sub-active part being provided to form a first electrode of the first transistor, the second sub-active part being provided to form a second electrode of the first transistor, and a portion of the third sub-active part being provided to form a channel region of the first transistor, and an orthographic projection of the first conductive part on the base substrate covering an orthographic projection of the third sub-active part on the base substrate;
a third gate insulating layer, located on a surface of the second active layer away from the base substrate, an orthographic projection of the third gate insulating layer on the base substrate covering an orthographic projection of the first active part on the base substrate; and
a third conductive layer, located on a surface of the third gate insulating layer away from the base substrate and including a second conductive part, the second conductive part being provided to form a second gate of the first transistor, and an orthographic projection of the second conductive part on the base substrate covering an orthographic projection of the channel region of the first transistor on the base substrate.

In an exemplary embodiment of the present disclosure, the third sub-active part includes a first constituent-active part, a second constituent-active part, and a third constituent-active part, the first constituent-active part is connected between the first sub-active part and the third constituent-active part, the second constituent-active part is connected between the third constituent-active part and the second sub-active part, and the third constituent-active part is provided to form the channel region of the first transistor; and
the orthographic projection of the second conductive part on the base substrate covers an orthographic projection of the third constituent-active part on the base substrate, and the orthographic projection of the second conductive part on the base substrate is located between an orthographic projection of the first constituent-active part on the base substrate and an orthographic projection of the second constituent-active part on the base substrate.

In an exemplary embodiment of the present disclosure, a difference between a sheet resistance of the first constituent-active part and a sheet resistance of the second constituent-active part is smaller than a predetermined value of 0-100 Ω/sq, the sheet resistance of the first constituent-active part is smaller than a sheet resistance of the first sub-active part, and the sheet resistance of the first constituent-active part is smaller than a sheet resistance of the second sub-active part.

In an exemplary embodiment of the present disclosure, a difference between a sheet resistance of the first constituent-active part and a sheet resistance of the second constituent-active part is smaller than a predetermined value of 0-1000 Ω/sq, and the sheet resistance of the first constituent-active part is 2000-200000 Ω/sq.

In an exemplary embodiment of the present disclosure, a resistance of the first sub-active part is 500-20000 Ω/sq, and a sheet resistance of the second sub-active part is 500-2000 Ω/sq.

In an exemplary embodiment of the present disclosure, the display panel further includes:
a fourth conductive layer, located on a surface of the third conductive layer away from the base substrate, and the fourth conductive layer includes a third conductive part and a fourth conductive part; and
the third conductive part is connected to the first sub-active part through a first via hole, and the fourth conductive part is connected to the second sub-active part through a second via hole.

In an exemplary embodiment of the present disclosure, an orthographic projection of the first via hole on the base substrate is located on an orthographic projection of the first sub-active part on the base substrate, and an orthographic projection of the second via hole on the base substrate is located on an orthographic projection of the second sub-active part on the base substrate;
an area of the orthographic projection of the first via hole on the base substrate is smaller than or equal to an area of the orthographic projection of the first sub-active part on the base substrate; and
an area of the orthographic projection of the second via hole on the base substrate is smaller than or equal to an area of the orthographic projection of the second sub-active part on the base substrate.

In an exemplary embodiment of the present disclosure, an orthographic projection of an edge of the first sub-active part on the base substrate at least partially overlaps with the orthographic projection of the first conductive part on the base substrate; and an orthographic projection of an edge of the second sub-active part on the base substrate at least partially overlaps with the orthographic projection of the first conductive part on the base substrate.

In an exemplary embodiment of the present disclosure, the first active part further includes:

a sixth sub-active part, located between the first sub-active part and the third sub-active part, an orthographic projection of the sixth sub-active part on the base substrate being located between an orthographic projection of the first sub-active part on the base substrate and the orthographic projection of the first conductive part on the base substrate; and a sheet resistance of the sixth sub-active part is 2000-200000 $\Omega$/sq.

In an exemplary embodiment of the present disclosure, the first transistor is an oxide transistor.

In an exemplary embodiment of the present disclosure, the display panel further includes a pixel driving circuit, and the pixel driving circuit includes the first transistor;

the pixel driving circuit further includes a driving transistor, the first electrode of the first transistor is connected to a gate of the driving transistor, and the second electrode of the first transistor is connected to a first initial signal terminal; and the pixel driving circuit further includes a second transistor, a first electrode of the second transistor is connected to the gate of the driving transistor, a second electrode of the second transistor is connected to a second electrode of the driving transistor, and the second transistor is an oxide transistor.

In an exemplary embodiment of the present disclosure, the first active part further includes:

a fourth sub-active part, provided to form the second electrode of the second transistor; and a fifth sub-active part, connected between the fourth sub-active part and the first sub-active part, and a portion of the fifth sub-active part being provided to form a channel region of the second transistor;

the first sub-active part is further used as the first electrode of the second transistor;

the second conductive layer further includes a fifth conductive part, the fifth conductive part is provided to form a first gate of the second transistor, and an orthographic projection of the fifth conductive part on the base substrate covers an orthographic projection of the fifth sub-active part on the base substrate;

the third conductive layer further includes a sixth conductive part, the sixth conductive part is provided to form a second gate of the second transistor, and an orthographic projection of the sixth conductive part on the base substrate covers an orthographic projection of the channel region of the second transistor on the base substrate.

In an exemplary embodiment of the present disclosure, the fifth sub-active part includes a fourth constituent-active part, a fifth constituent-active part, and a sixth constituent-active part, and the fourth constituent-active part is connected between the first sub-active part and the sixth constituent-active part, the fifth constituent-active part is connected between the sixth constituent-active part and the fourth sub-active part, and the sixth constituent-active part is provided to form the channel region of the second transistor; and the orthographic projection of the sixth conductive part on the base substrate covers an orthographic projection of the sixth constituent-active part on the base substrate, and the orthographic projection of the sixth conductive part on the base substrate is located between an orthographic projection of the fifth constituent-active part on the base substrate and an orthographic projection of the fourth constituent-active part on the base substrate.

In an exemplary embodiment of the present disclosure, a difference between a sheet resistance of the fourth constituent-active part and a sheet resistance of the fifth constituent-active part is smaller than a predetermined value of 0-100 $\Omega$/sq, the sheet resistance of the fourth constituent-active part is smaller than a sheet resistance of the fourth sub-active part, and the sheet resistance of the fourth constituent-active part is smaller than a sheet resistance of the first sub-active part.

In an exemplary embodiment of the present disclosure, a difference between a sheet resistance of the fourth constituent-active part and a sheet resistance of the fifth constituent-active part is smaller than a predetermined value of 0-1000 $\Omega$/sq, and the sheet resistance of the fourth constituent-active part is 2000-200000 $\Omega$/sq.

An aspect of the present disclosure provides a method for manufacturing a display panel including a first transistor, wherein the method for manufacturing the display panel includes:

providing a base substrate;

forming a second conductive layer on a surface of the base substrate, the second conductive layer including a first conductive part, and the first conductive part being provided to form a first gate of the first transistor;

forming a second active material layer on a surface of the second conductive layer away from the base substrate, the second active material layer including a first active material part, the first active material part including a first sub-active material part, a second sub-active material part, and a third sub-active material part connected between the first sub-active material part and the second sub-active material part, a portion of the third sub-active material part being provided to form a channel region of the first transistor, and an orthographic projection of the first conductive part on the base substrate covering an orthographic projection of the third sub-active material part on the base substrate;

forming a third gate insulating layer on a surface of the second active material layer away from the base substrate, an orthographic projection of the third gate insulating layer on the base substrate covering an orthographic projection of the first active material part on the base substrate;

forming a third conductive layer on a surface of the third gate insulating layer away from the base substrate, the third conductive layer including a second conductive part, the second conductive part being provided to form a second gate of the first transistor, and an orthographic projection of the second conductive part on the base substrate partially overlapping with an orthographic projection of the third sub-active material part on the base substrate; and performing a conducting treatment on the second active material layer by using the third conductive layer as a mask.

In an exemplary embodiment of the present disclosure, the first transistor is an oxide transistor, and the second active material layer is an oxide semiconductor.

In an exemplary embodiment of the present disclosure, the performing the conducting treatment on the second active material layer by using the third conductive layer as the mask includes:

forming a second dielectric layer on a surface of the third conductive layer away from the base substrate by using a vapor chemical deposition process, wherein conducting ions are generated during forming the second dielectric layer, and the conducting ions can realize conductivity of the second active material layer.

In an exemplary embodiment of the present disclosure, a material of the second dielectric layer is silicon nitride, and the conducting ions are hydrogen ions.

In an exemplary embodiment of the present disclosure, the method for manufacturing the display panel further includes:

forming a first via hole and a second via hole penetrating through the third gate insulating layer and the second dielectric layer by using dry etching gas, an orthographic projection of the first via hole on the base substrate being located on an orthographic projection of the first sub-active material part on the base substrate, and an orthographic projection of the second via hole on the base substrate being located on an orthographic projection of the second sub-active material part on the base substrate, wherein the dry etching gas can generate the conducting ions during a dry etching process, and the conducting ions can realize the conductivity of the second active material layer; and forming a fourth conductive layer on a surface of the second dielectric layer away from the base substrate, the fourth conductive layer including a third conductive part and a fourth conductive part, wherein the third conductive part is connected to the first sub-active material part through the first via hole, and the fourth conductive part is connected to the second sub-active material part through the second via hole.

In an exemplary embodiment of the present disclosure, an area of the orthographic projection of the first via hole on the base substrate is smaller than or equal to an area of the orthographic projection of the first sub-active material part on the base substrate; and an area of the orthographic projection of the second via hole on the base substrate is smaller than or equal to an area of the orthographic projection of the second sub-active material part on the base substrate.

In an exemplary embodiment of the present disclosure, an orthographic projection of an edge of the first sub-active material part on the base substrate at least partially overlaps with the orthographic projection of the first conductive part on the base substrate; and an orthographic projection of an edge of the second sub-active material part on the base substrate at least partially overlaps with the orthographic projection of the first conductive part on the base substrate.

In an exemplary embodiment of the present disclosure, the performing the conducting treatment on the second active material layer by using the third conductive layer as the mask includes:

implanting the conducting ions into the second active material layer through an ion implantation process.

In an exemplary embodiment of the present disclosure, the third sub-active material part includes a first constituent-active material part, a second constituent-active material part, and a third constituent-active material part, the first constituent-active material part is connected between the first sub-active material part and the third constituent-active material part, the second constituent-active material part is connected between the third constituent-active material part and the second sub-active material part; and the orthographic projection of the second conductive part on the base substrate covers an orthographic projection of the third constituent-active material part on the base substrate.

An aspect of the present disclosure provides a display device, including the display panel described above.

It is to be understood that the foregoing general description and the following detailed description are exemplary and explanatory only and are not restrictive of the present disclosure.

BRIEF DESCRIPTION OF THE DRAWINGS

The accompanying drawings herein, which are incorporated in and constitute a part of this specification, illustrate embodiments consistent with the present disclosure, and together with the description serve to explain the principle of the present disclosure. Obviously, the drawings in the following description are only some embodiments of the present disclosure, and for a person skilled in the art, other drawings may also be obtained from these drawings without creative effort.

DETAILED DESCRIPTION

Figure 1:
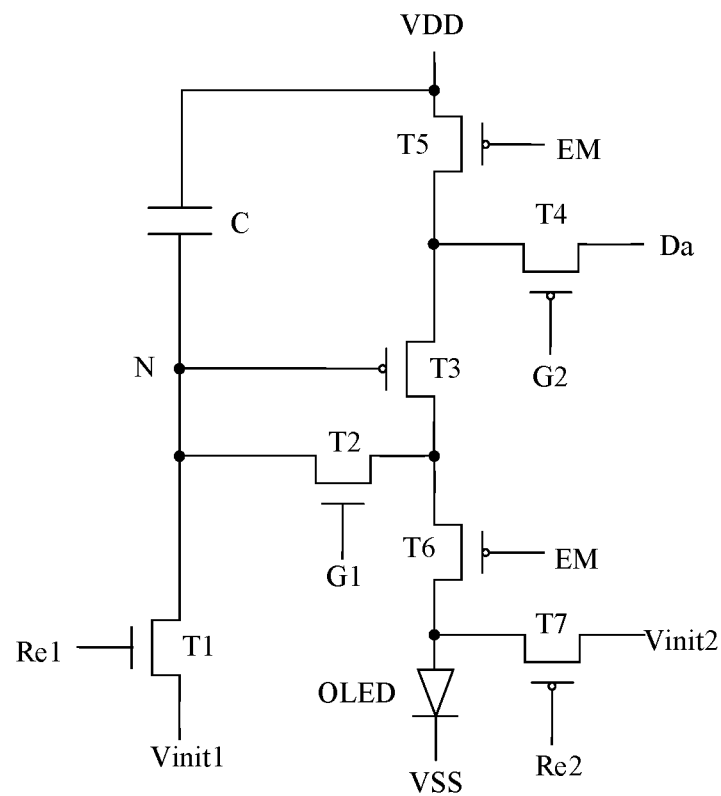
FIG. 1 is a schematic diagram of a circuit structure of a pixel driving circuit in the related art.

Example embodiments will now be described more fully with reference to the accompanying drawings. Example embodiments, however, may be embodied in various forms and should not be construed as being limited to the examples set forth herein. Rather, these embodiments are provided so that the present disclosure will be thorough and complete, and will fully convey the concept of example embodiments to a person skilled in the art. The same reference numerals in the drawings denote the same or similar structures, and thus their detailed descriptions will be omitted herein.

The terms "a", "an", "the" are used to indicate the presence of one or more elements/components/etc.; and the terms "including" and "having" are used to indicate an open-ended inclusive meaning and refer to that additional elements/components/etc. may be present in addition to the listed elements/components/etc. . . .

Although relative terms such as "upper" and "lower" are used in this specification to describe the relative relationship of one component shown to another component, these terms are used in this specification only for convenience of description for example according to the direction of the example described. It can be understood that if a device shown is turned upside down, a component described as being "upper" will become a "lower" component. Other relative terms such as "high", "low", "top", "bottom", "left" and "right" are to be understood similarly. When a certain structure is "on" another structure, it may mean that the certain structure is integrally formed on said another structure, or that the certain structure is "directly" arranged on said another structure, or that the certain structure is "indirectly" arranged on said another structure through an additional structure.

FIG. 1 is a schematic diagram of a circuit structure of a pixel driving circuit in the related art. The pixel driving circuit may include a driving transistor T3, a first transistor T1, a second transistor T2, a third transistor T3, a fourth transistor T4, a fifth transistor T5, a sixth transistor T6, a seventh transistor T7, and a capacitor C. A first electrode of the fourth transistor T4 is connected to a data signal terminal Da, a second electrode of the fourth transistor T4 is connected to a first electrode of the driving transistor T3, and a gate of the fourth transistor T4 is connected to a second gate driving signal terminal G2. A first electrode of the fifth transistor T5 is connected to a first power supply terminal VDD, a second electrode of the fifth transistor T5 is connected to the first electrode of the driving transistor T3, and a gate of the fifth transistor T5 is connected to an enable signal terminal EM. A gate of the driving transistor T3 is connected to a node N. A first electrode of the second transistor T2 is connected to the node N, a second electrode of the second transistor T2 is connected to a second electrode of the driving transistor T3, a gate of the second transistor T2 is connected to a first gate driving signal terminal G1. A first electrode of the sixth transistor T6 is connected to the second electrode of the driving transistor T3, a second electrode of the sixth transistor T6 is connected to a first electrode of the seventh transistor T7, and a gate of the sixth transistor T6 is connected to the enable signal terminal EM. A second electrode of the seventh transistor T7 is connected to a second initial signal terminal Vinit2, and a gate of the seventh transistor T7 is connected to a second reset signal terminal Re2. A first electrode of the first transistor T1 is connected to the node N, a second electrode of the first transistor T1 is connected to a first initial signal terminal Vinit1, and a gate of the first transistor T1 is connected to a first reset signal terminal Re1. The capacitor C is connected between the first power supply terminal VDD and the node N. The pixel driving circuit may be connected to a light-emitting unit OLED for driving the light-emitting unit OLED to emit light. The light-emitting unit OLED may be connected between the second electrode of the sixth transistor T6 and a second power supply terminal VSS. The first transistor T1 and the second transistor T2 may be N-type metal oxide transistors, and the N-type metal oxide transistor has a smaller leakage current, so that it may prevent the leakage of the node N through the first transistor T1 and the second transistor T2 in a light-emitting stage. Meanwhile, the driving transistor T3, the third transistor T3, the fourth transistor T4, the fifth transistor T5, the sixth transistor T6, and the seventh transistor T7 may be P-type low temperature polysilicon transistors which have high carrier mobility, so that it may realize a display panel with high resolution, high response speed, high pixel density, and high aperture ratio. The first initial signal terminal and the second initial signal terminal may output the same or different voltage signals according to actual conditions.

Figure 2:
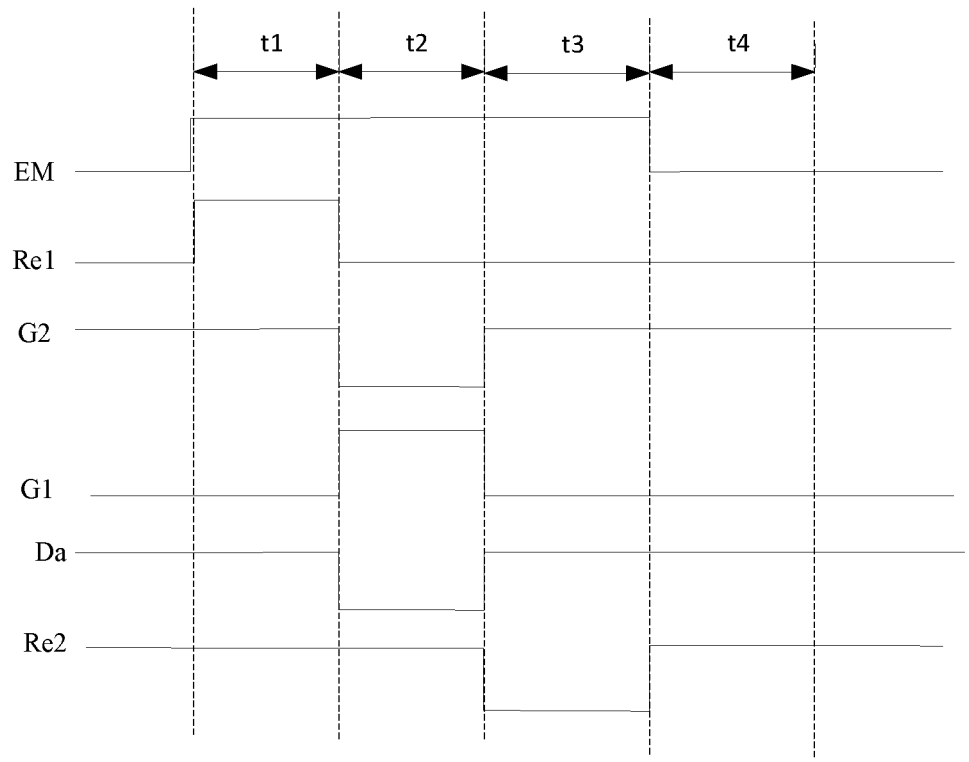
FIG. 2 is a timing diagram of each node in a driving method of the pixel driving circuit of FIG. 1.

FIG. 2 is a timing diagram of each node in a driving method of the pixel driving circuit of FIG. 1, in which G1 represents the timing of the first gate driving signal terminal G1, G2 represents the timing of the second gate driving signal terminal G2, Re1 represents the timing of the first reset signal terminal Re1, Re2 represents the timing of the second reset signal terminal Re2, EM represents the timing of the enable signal terminal EM, and Da represents the timing of the data signal terminal Da. The driving method of the pixel driving circuit may include a first reset stage t1, a compensation stage t2, a second reset stage T3, and a light-emitting stage t4. In the first reset stage t1, the first reset signal terminal Re1 outputs a high-level signal, the first transistor T1 is turned on, and the first initial signal terminal Vinit1 inputs an initial signal to the node N. In the compensation stage t2, the first gate driving signal terminal G1 outputs a high-level signal, the second gate driving signal terminal G2 outputs a low-level signal, the fourth transistor T4, the second transistor T2, and the data signal terminal Da output a driving signal to write a voltage Vdata+Vth into the node N, where Vdata is the voltage of the driving signal, and Vth is a threshold voltage of the driving transistor T3. In the second reset stage t3, the second reset signal terminal Re2 outputs a low-level signal, the seventh transistor T7 is turned on, and the second initial signal terminal Vinit2 inputs an initial signal to the second electrode of the sixth transistor T6. In the light-emitting stage t4, the enable signal terminal EM outputs a low-level signal, the sixth transistor T6 and the fifth transistor T5 are turned on, and the driving transistor T3 emits light under the action of the voltage Vdata+Vth stored in the capacitor C. The outputting current formula of the driving transistor is $I=(\mu W Cox/2L)(Vgs-Vth)^2$, where $\mu$ is a carrier mobility, Cox is a gate capacitance per unit area, W is a width of the channel of the driving transistor, L is a length of the channel of the driving transistor, Vgs is a gate-source voltage difference of the driving transistor, and Vth is a threshold voltage of the driving transistor. The output current of the driving transistor in the pixel driving circuit of the present disclosure is $I=(\mu W Cox/2L)(Vdata+Vth-Vdd-Vth)^2$. The pixel driving circuit may avoid the influence of the threshold value of the driving transistor on the output current thereof. It should be understood that the pixel driving circuit shown in FIG. 1 may also have other driving manners. For example, both the first transistor T1 and the seventh transistor T7 may be reset in the first reset stage, so that the driving method may not set the second reset stage.

Figure 3:
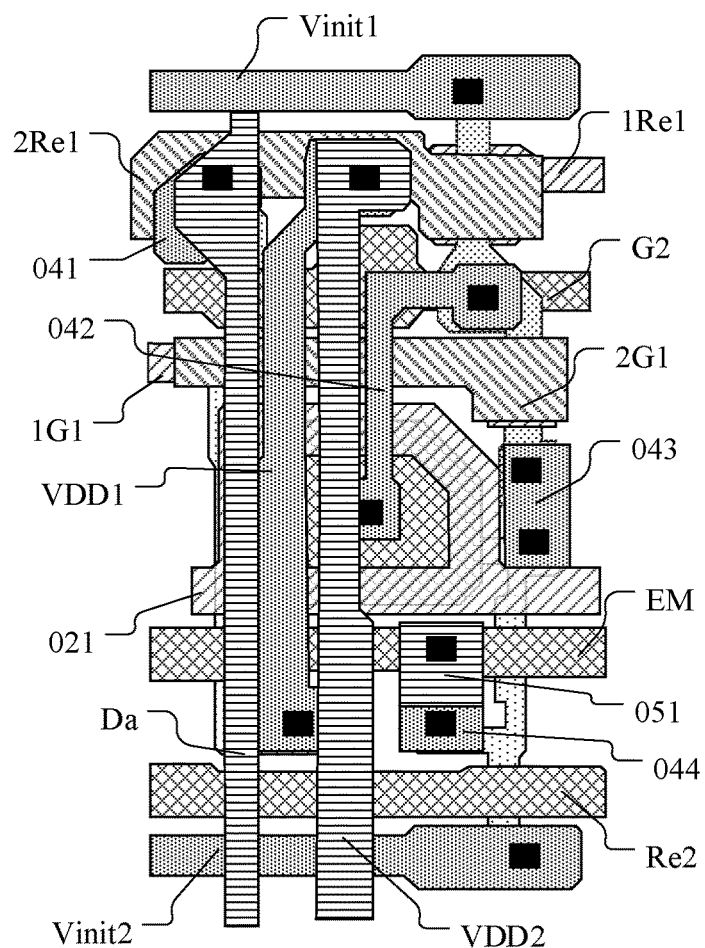
FIG. 3 is a structural layout of a display panel in the related art.
Figure 4:
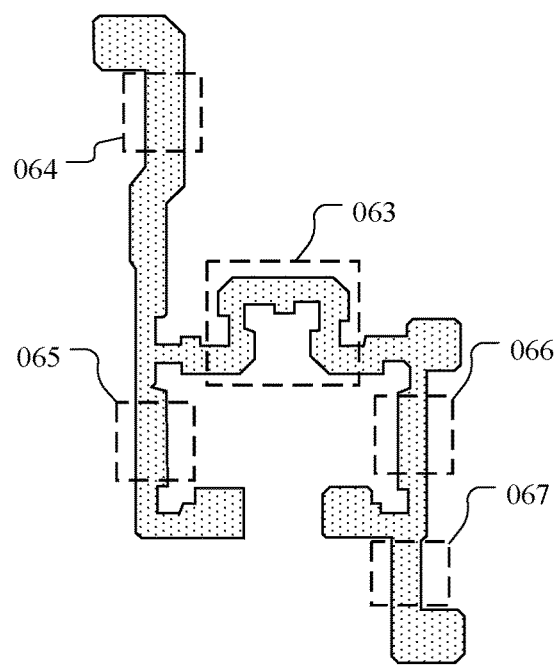
FIG. 4 is a structural layout of a first active layer in FIG. 3.
Figure 5:
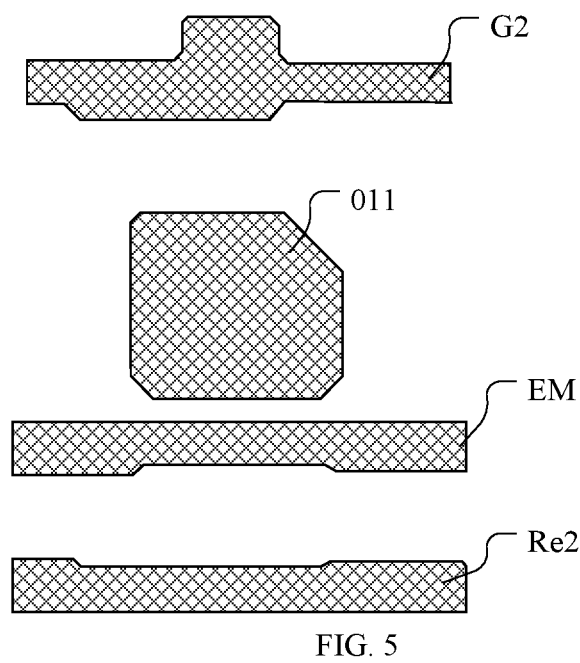
FIG. 5 is a structural layout of a first conductive layer in FIG. 3.
Figure 6:
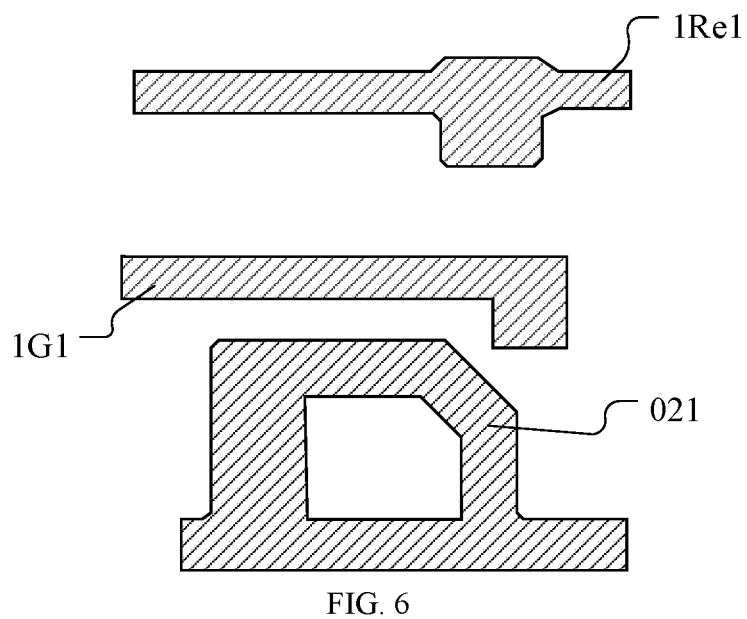
FIG. 6 is a structural layout of a second conductive layer in FIG. 3.
Figure 7:
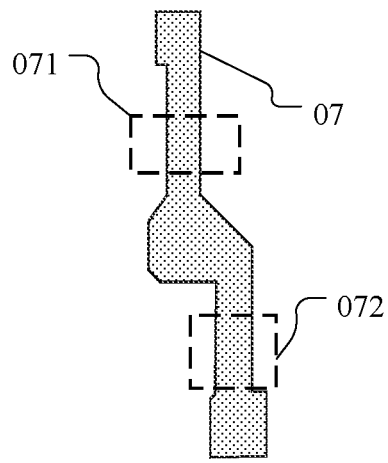
FIG. 7 is a structural layout of a second active layer in FIG. 3.
Figure 8:
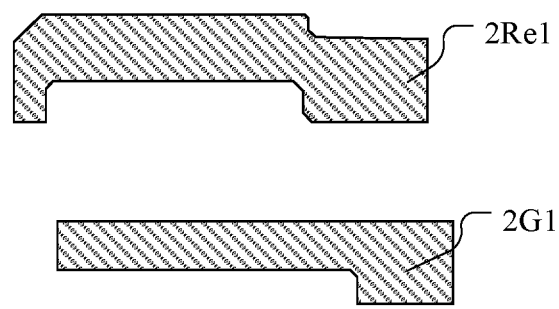
FIG. 8 is a structural layout of a third conductive layer in FIG. 3.
Figure 9:
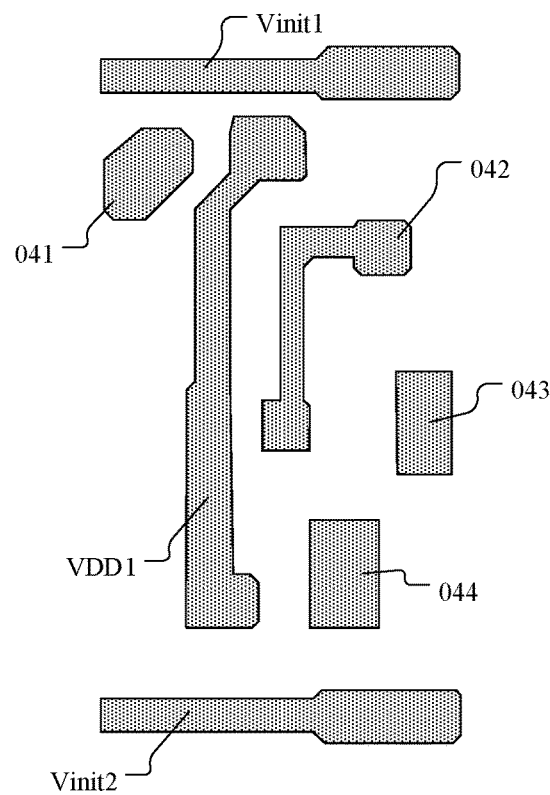
FIG. 9 is a structural layout of a fourth conductive layer in FIG. 3.
Figure 10:
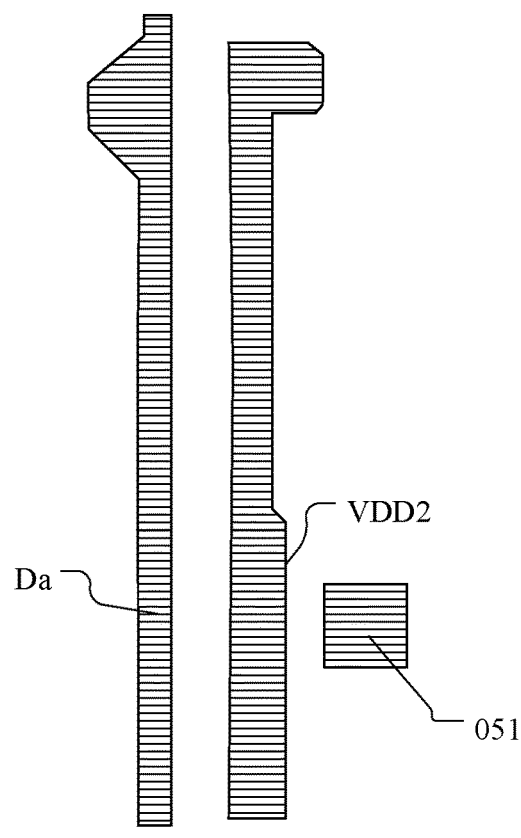
FIG. 10 is a structural layout of a fifth conductive layer in FIG. 3.
Figure 11:
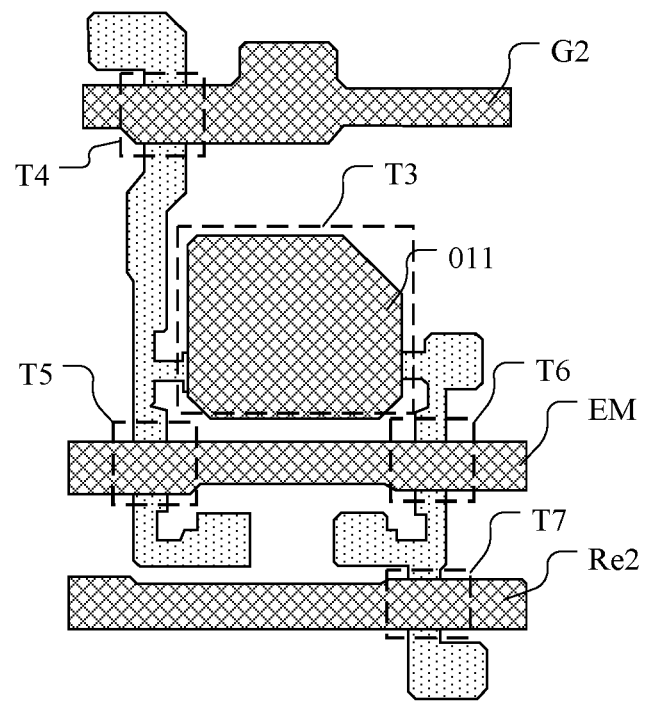
FIG. 11 is a structural layout of the first active layer and the first conductive layer in FIG. 3.
Figure 12:
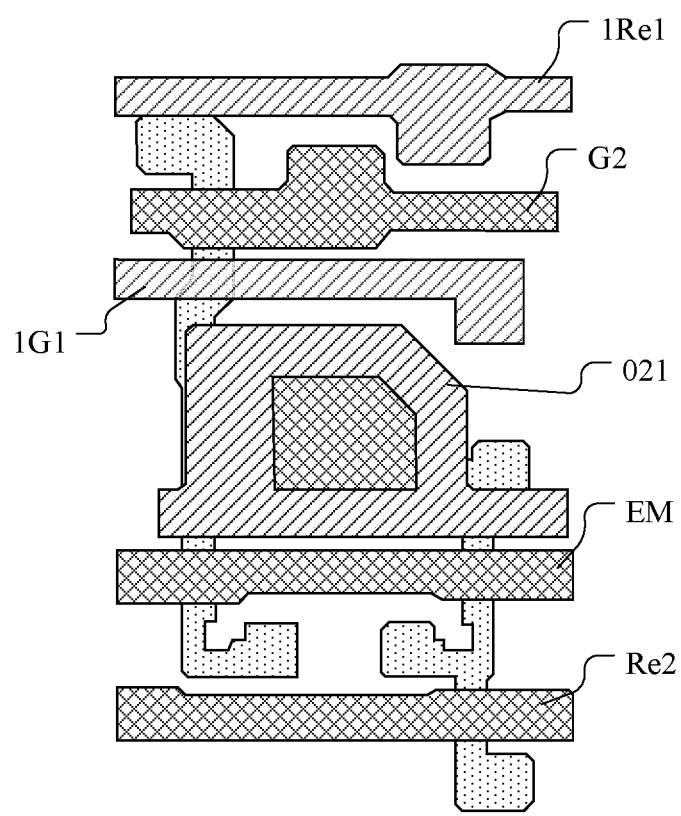
FIG. 12 is a structural layout of the first active layer, the first conductive layer, and the second conductive layer in FIG. 3.
Figure 13:
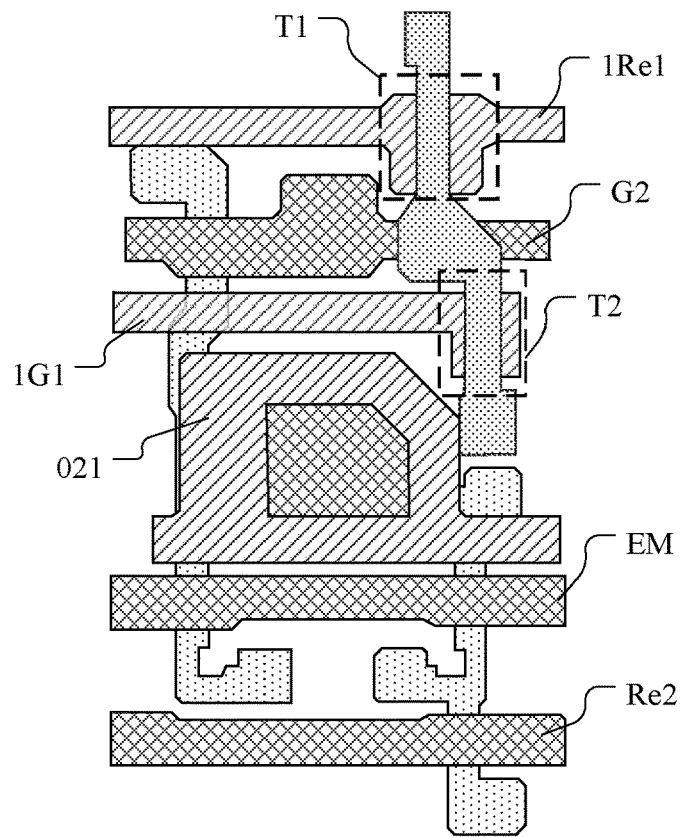
FIG. 13 is a structural layout of the first active layer, the first conductive layer, the second conductive layer, and the second active layer in FIG. 3.
Figure 14:
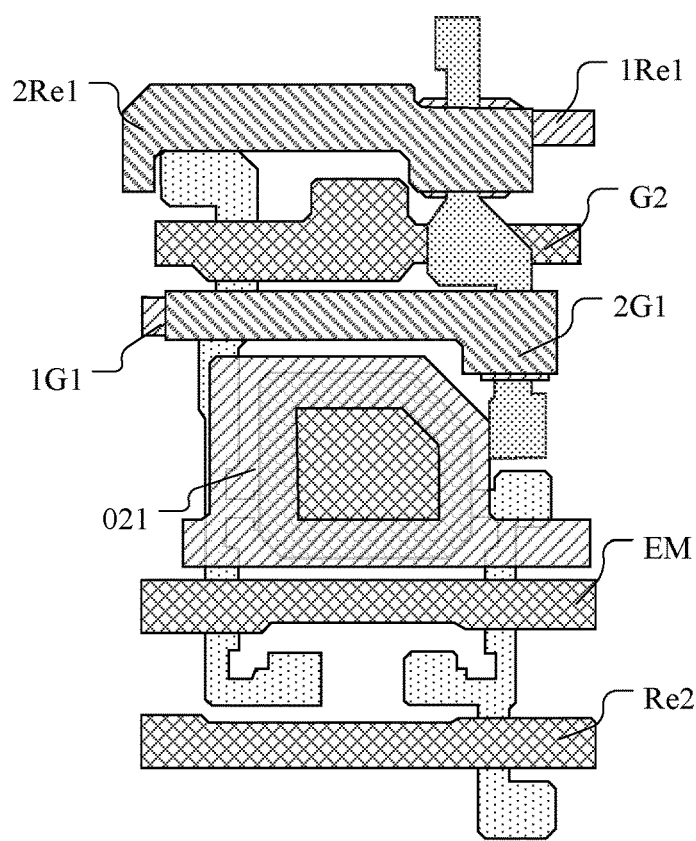
FIG. 14 is a structural layout of the first active layer, the first conductive layer, the second conductive layer, the second active layer, and the third conductive layer in FIG. 3.
Figure 15:
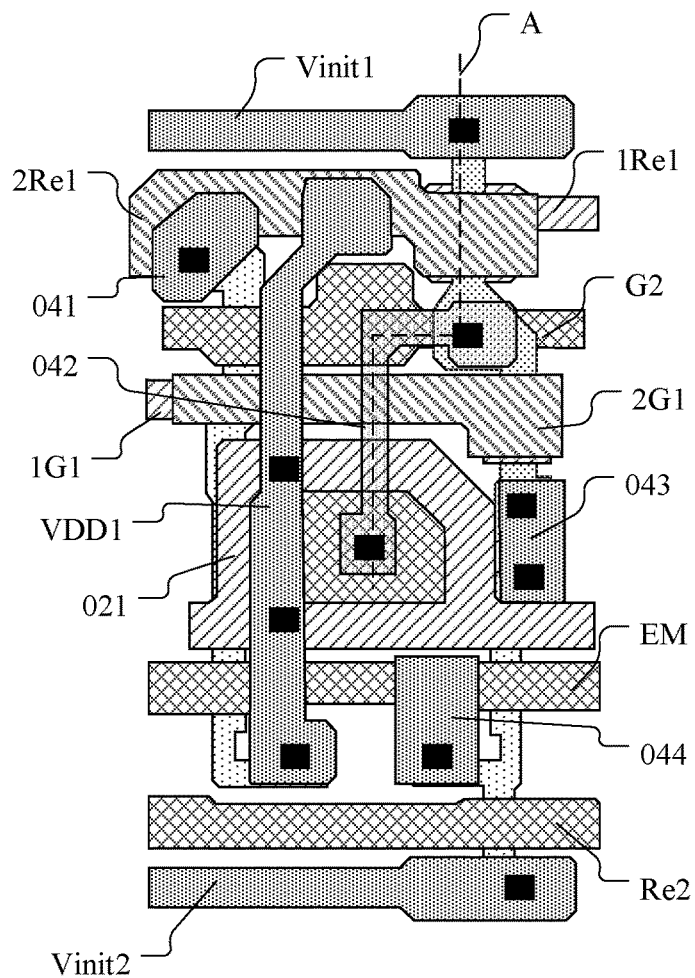
FIG. 15 is a structural layout of the first active layer, the first conductive layer, the second conductive layer, the second active layer, the third conductive layer, and the fourth conductive layer in FIG. 3.

In the related art, the display panel may include the pixel driving circuit shown in FIG. 1, and the display panel may further include a base substrate, a first active layer, a first conductive layer, a second conductive layer, a second active layer, a third conductive layer, a fourth conductive layer, and a fifth conductive layer, which are stacked in sequence. As shown in FIGS. 3-15, FIG. 3 is a structural layout of a display panel in the related art; FIG. 4 is a structural layout of a first active layer in FIG. 3; FIG. 5 is a structural layout of a first conductive layer in FIG. 3; FIG. 6 is a structural layout of a second conductive layer in FIG. 3; FIG. 7 is a structural layout of a second active layer in FIG. 3; FIG. 8 is a structural layout of a third conductive layer in FIG. 3; FIG. 9 is a structural layout of a fourth conductive layer in FIG. 3; FIG. 10 is a structural layout of a fifth conductive layer in FIG. 3; FIG. 11 is a structural layout of the first active layer and the first conductive layer in FIG. 3; FIG. 12 is a structural layout of the first active layer, the first conductive layer, and the second conductive layer in FIG. 3; FIG. 13 is a structural layout of the first active layer, the first conductive layer, the second conductive layer, and the second active layer in FIG. 3; FIG. 14 is a structural layout of the first active layer, the first conductive layer, the second conductive layer, the second active layer, and the third conductive layer in FIG. 3; and FIG. 15 is a structural layout of the first active layer, the first conductive layer, the second conductive layer, the second active layer, the third conductive layer, and the fourth conductive layer in FIG. 3;

As shown in FIGS. 3, 4 and 11, the first active layer may include active parts 064, 065, 066 and 067. The active part 064 is used to form a channel region of the fourth transistor, the active part 065 is used to form a channel region of the fifth transistor, the active part 066 is used to form a channel region of the sixth transistor, and the active part 067 is used to form a channel region of the seventh transistor. An active part 063 is used to form a channel region of the driving transistor T3. The first active layer may be formed of a polycrystalline silicon semiconductor.

As shown in FIGS. 3, 5 and 11, the first conductive layer may include a second gate driving signal line G2, an enable signal line EM, a second reset signal line Re2, and a conductive part 011. The second gate driving signal line G2 is used for providing the second gate driving signal terminal G2 in FIG. 1, the enable signal line EM is used for providing the enable signal terminal EM in FIG. 1, and the second reset signal line Re2 is used for providing the second reset signal terminal Re2 in FIG. 1. The conductive part 011 is used to form the gate of the driving transistor T3 and an electrode of the capacitor C. The first active layer may be formed by performing a conducting treatment using the first conductive layer as a mask, that is, the part shielded by the first conductive layer forms the channel region of the transistor, and the part not shielded by the first conductive layer forms a conductor structure.

As shown in FIGS. 3, 6 and 12, the second conductive layer may include a first sub-reset signal line 1Re1, a first sub-gate driving signal line 1G1, and a conductive part 021. The first sub-reset signal line 1Re1 is used for providing the first reset signal terminal in FIG. 1, the first sub-gate driving signal line 1G1 is used for providing the first gate driving signal terminal in FIG. 1, and the conductive part 021 may form another electrode of the capacitor C.

As shown in FIGS. 3, 7 and 13, the second active layer may include an active part 07, and the active part 07 may include an active part 071 and an active part 072. The active part 071 is used to form the channel region of the first transistor. The active part 072 is used to form the channel region of the second transistor. The second active layer may be formed of an oxide semiconductor such as indium gallium zinc oxide.

As shown in FIGS. 3, 8 and 14, the third conductive layer may include a second sub-reset signal line 2Re1, and a second sub-gate driving signal line 2G1. The second sub-reset signal line 2Re1 is used to provide the first reset signal terminal in FIG. 1, and the second sub-gate driving signal line 2G1 is used for providing the first gate driving signal terminal in FIG. 1. The second sub-reset signal line 2Re1 and the first sub-reset signal line 1R1 may be connected through a via hole, and the second sub-gate driving signal line 2G1 and the first sub-gate driving signal line 1G1 may be connected through a via hole. The second active layer may be formed by performing a conducting treatment using the third conductive layer as a mask, that is, the part shielded by the third conductive layer forms the channel region of the transistor, and the part not shielded by the third conductive layer forms a conductor structure.

As shown in FIGS. 3, 9 and 15, the fourth conductive layer may include a first power supply line VDD1, a first initial signal line Vinit1, a second initial signal line Vinit2, and connection parts 041, 042, 043 and 044. The first power supply line VDD1 is used to provide the first power supply terminal in FIG. 1, the first initial signal line Vinit1 is used to provide the first initial signal terminal in FIG. 1, and the second initial signal line Vinit2 is used to provide the second initial signal terminal in FIG. 1. The connection part 041 may be connected to the first active layer at the side of the active part 064 through a via hole (black square) to connect to the first electrode of the fourth transistor. The connection part 042 may be connected to the conductive part 011 and the second active layer between the active part 071 and the active part 072 through via holes respectively, to connect the gate of the driving transistor and the first electrode of the first transistor, and to connect the gate of the driving transistor and the first electrode of the second transistor. The connection part 043 may be respectively connected to the first active layer at the side of the active part 066 and the second active layer at the side of the active part 072 through via holes, so as to connect the first electrode of the sixth transistor and the first electrode of the second transistor. The connection part 044 may be connected to the first active layer at the side of the active part 066 through a via hole to connect to the second electrode of the sixth transistor. The first power supply line VDD1 may be connected to the first active layer at the side of the active part 065 through a via hole to connect the first electrode of the fifth transistor and the first power supply terminal. The first power supply line VDD1 may also be connected to the conductive part 021 through a via hole to connect the capacitor C and the first power supply terminal. The first initial signal line Vinit1 may be connected to the second active layer at the side of the active part 071 through a via hole, so as to connect the second electrode of the first transistor and the first initial signal terminal. The second initial signal line may be connected to the first active layer at the side of the active part 067 through a via hole, so as to connect the second initial signal terminal and the second electrode of the seventh transistor.

As shown in FIGS. 3 and 10, the fifth conductive layer may include a second power supply line VDD2, a data line Da, and a connection part 051. The second power supply line VDD2 is used to provide the first power supply terminal in FIG. 1, and the data line Da is used to provide the data signal terminal in FIG. 1. The second power supply line VDD2 may be connected to the first power supply line VDD1 through a via hole. The data line Da may be connected to the connection part 041 through a via hole to connect the first electrode of the fourth transistor and the data signal terminal. The connection part 051 may be connected to the connection part 044 through a via hole, and the connection part 051 may be used to be connected to an anode of the light-emitting unit in FIG. 1. As shown in FIG. 3, the orthographic projection of the first power supply line VDD1 on the base substrate may be located between the orthographic projection of the data line Da on the base substrate and the orthographic projection of the conductive part 011 on the base substrate, and the first power supply line VDD1 may shield the interference from the data line Da on the conductive part 011.

Figure 16:
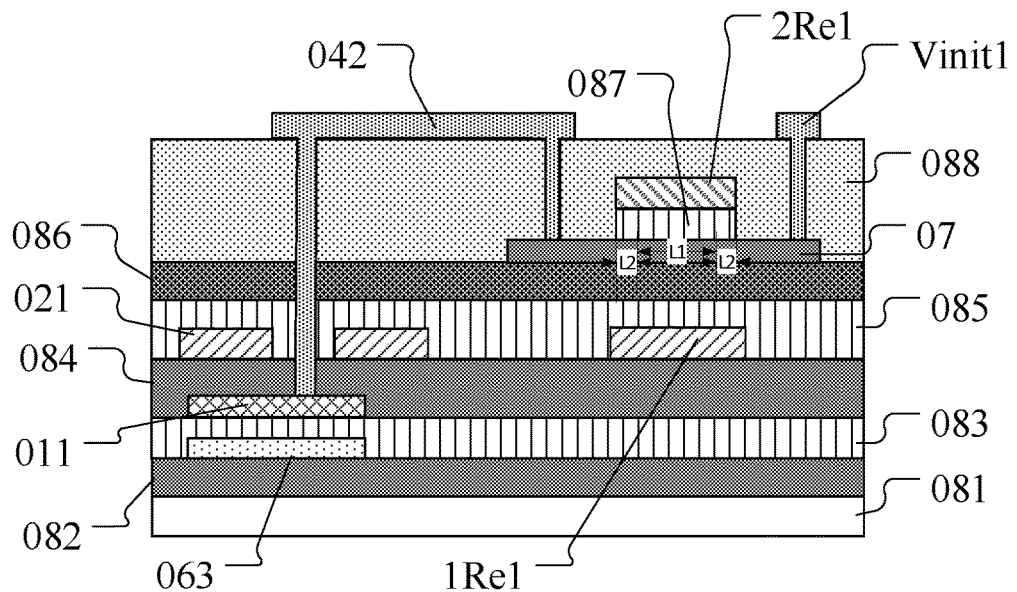
FIG. 16 is a partial cross-sectional view taken along a dotted line A in FIG. 15.

FIG. 16 is a partial cross-sectional view taken along a dotted line A in FIG. 15. As shown in FIG. 16, the display panel further includes a first buffer layer 082, a first gate insulating layer 083, a second gate insulating layer 084, a first dielectric layer 085, a second buffer layer 086, a third gate insulating layer 087, and a second dielectric layer 088. The base substrate 081, the first buffer layer 082, the first active layer, the first gate insulating layer 083, the first conductive layer, the second gate insulating layer 084, the second conductive layer, the first dielectric layer 085, the second buffer layer 086, the second active layer, the third gate insulating layer 087, the third conductive layer, the second dielectric layer 088, and the fourth conductive layer are stacked in sequence. As shown in FIG. 16, in the related art, the method of conducting the second active layer is as follows: the third conductive layer is formed on a surface of the third gate insulating layer 087 away from the base substrate 081, the portion of the third gate insulating layer not covered by the third conductive layer is removed, and then the second dielectric layer 088 is formed on a surface of the third conductive layer away from the base substrate by a vapor chemical deposition process. In the process of forming the second dielectric layer 088, conducting ions that can realize the conductivity of the second active layer will be generated. For example, the second dielectric layer may be silicon nitride, and the second dielectric layer may be synthesized from silane and nitrogen. Hydrogen ions will be formed during the synthesis of the second dielectric layer, and the hydrogen ions may realize the conductivity of the active part 07. However, in the process of conducting the active part 07, lateral diffusion of hydrogen ions may make an actual length L1 of the channel region of the second transistor smaller than a designed length L1+2L2 thereof. The designed length L1+2L2 of the channel region is the length of the gate of the transistor in the lateral direction. Therefore, the short-channel effect of the second transistor is likely to occur. In this case, the threshold voltage Vth of the second transistor is highly related to the channel length thereof, which is not conducive to the realization of the stability and uniformity of the threshold voltage Vth.

Figure 17:
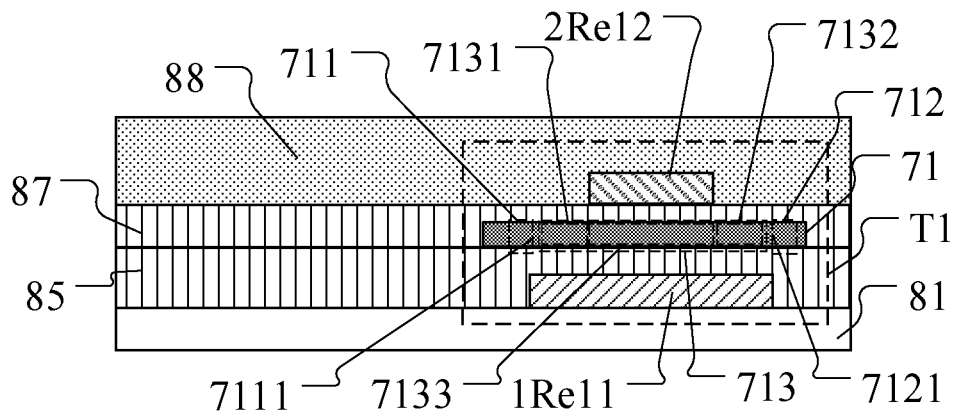
FIG. 17 is a process flow diagram of a method for manufacturing a display panel according to an exemplary embodiment of the present disclosure.

In view of the above, an exemplary embodiment provides a method for manufacturing a display panel. FIG. 17 is a process flow diagram of a method for manufacturing a display panel according to an exemplary embodiment of the present disclosure. The display panel may include a first transistor T1, and the method for manufacturing the display panel may include steps S1 to S6.

In step S1, providing a base substrate 81 is provided.

In step S2, a second conductive layer is formed on a surface of the base substrate 81. The second conductive layer includes a first conductive part 1Re11, and the first conductive part 1Re11 is provided to form a first gate of the first transistor T1.

In step S3, a second active material layer is formed on a surface of the second conductive layer away from the base substrate 81. The second active material layer includes a first active material part 71, the first active material part 71 includes a first sub-active material part 711, a second sub-active material part 712, and a third sub-active material part 713 connected between the first sub-active material part 711 and the second sub-active material part 712.

A portion of the third sub-active material part 713 is provided to form a channel region of the first transistor T1, and an orthographic projection of the first conductive part 1Re11 on the base substrate covers an orthographic projection of the third sub-active material part 713 on the base substrate In step S4, a third gate insulating layer 87 is formed on a surface of the second active material layer away from the base substrate 81. An orthographic projection of the third gate insulating layer 87 on the base substrate covers an orthographic projection of the first active material part 71 on the base substrate.

In step S5, a third conductive layer is formed on a surface of the third gate insulating layer 87 away from the base substrate 81. The third conductive layer includes a second conductive part 2Re12, the second conductive part 2Re12 is provided to form a second gate of the first transistor, and an orthographic projection of the second conductive part 2Re12 on the base substrate partially overlaps with an orthographic projection of the third sub-active material part 713 on the base substrate. An orthographic projection of a portion of the third sub-active material part 713 on the base substrate does not overlap with the orthographic projection of the second conductive part 2Re12 on the base substrate. The third conductive layer may be formed by a photolithography process. The third conductive layer may be etched by a dry etching process. The dry etching process has small CD Bias (Critical Dimension Bias, a deviation between a photoresist and an edge of an etched body), so that the third conductive layer with a high dimensional accuracy may be realized. The dry etching process may realize the CD Bias of 0.5 microns.

In step S6, a conducting treatment is performed on the second active material layer by using the third conductive layer as a mask.

In an exemplary embodiment, the first transistor may be an oxide transistor, and the second active material layer may be an oxide semiconductor. For example, the material of the second active material layer may be indium gallium zinc oxide. According to an exemplary embodiment, the display panel may include a pixel driving circuit, and the display driving circuit may be as shown in FIG. 1. In an exemplary embodiment, the first transistor may be the first transistor in FIG. 1. It should be understood that, in other exemplary embodiments, the pixel driving circuit in the display panel may also be of other structures, such as an 8T1C structure. The first transistor in FIG. 17 may also be a low-temperature polysilicon transistor, and the first transistor in FIG. 17 may also be located in other circuit structures in the display panel, for example, the first transistor may be located in a gate driving circuit in the display panel.

In an exemplary embodiment, as shown in FIG. 17, the performing the conducting treatment on the second active material layer by using the third conductive layer as the mask may include: forming a second dielectric layer 88 on a surface of the third conductive layer away from the base substrate by using a vapor chemical deposition process. Conducting ions can be generated during forming the second dielectric layer 88, and the conducting ions can realize conductivity of the portion of the second active material layer not covered by the third conductive layer. For example, the second dielectric layer 88 may be silicon nitride, the second dielectric layer 88 may be synthesized by silane and nitrogen gas, hydrogen ions may be formed during the synthesis process of the second dielectric layer 88, and the hydrogen ions can realize the conductivity of the second active material layer.

As shown in FIG. 17, when the conducting process is performed on the second active material layer in the exemplary embodiment, since the second active material layer is covered with the third gate insulating layer 87, the third gate insulating layer 87 can block the diffusion of the conducting ions, so that the diffusion amount of the conducting ions in the lateral direction is very small or even zero, and then the length, in the lateral direction, of the channel region formed by using the second conductive part 2Re12 as the mask is the same as the length of the second conductive part 2Re12 in the lateral direction, or the length of the channel region in the lateral direction is slightly smaller than the length of the second conductive part 2Re12 in the lateral direction. That is, the method for manufacturing the display panel may greatly reduce the value of L2 in FIG. 16, so that the method for manufacturing the display panel may form a larger-sized channel region under the action of the limited-sized second conductive part 2Re12. At the same time, since the third gate insulating layer 87 can block the diffusion of conducting ions, the ion doping concentration of the portion of the third sub-active material part 713 not covered by the second conductive part 2Re12 is relatively low, and the sheet resistance thereof is relatively large. Therefore, the turn-on current of the first transistor is small. In addition, in an exemplary embodiment, the orthographic projection of the first conductive part 1Re11 on the base substrate covers the orthographic projection of the third sub-active material part 713 on the base substrate, and under the action of the turn-on voltage, the sheet resistance of the third sub-active material part 713 located between the first electrode and the second electrode of the first transistor and not covered by the second conductive part 2Re12 is reduced, so that the first transistor may have a large turn-on current. In addition, since the third sub-active material part 713 not covered by the second conductive part 2Re12 has a large sheet resistance, the turn-off current of the first transistor is small, which may further reduce the leakage current at the node N passing through the first transistor during the light-emitting stage. It should be noted that the lateral direction in FIG. 17 may be the arrangement direction of the first sub-active material part 711, the third sub-active material part 713, and the second sub-active material part 712, that is, the length direction of the channel region.

In an exemplary embodiment, as shown in FIG. 17, the third sub-active material part 713 may include a first constituent-active material part 7131, a second constituent-active material part 7132, and a third constituent-active material part 7133. The first constituent-active material part 7131 may be connected between the first sub-active material part 711 and the third constituent-active material part 7133, and the second constituent-active material part 7132 may be connected between the third constituent-active material part 7133 and the second sub-active material part 712. The orthographic projection of the second conductive part 2Re12 on the base substrate may cover an orthographic projection of the third constituent-active material part 7133 on the base substrate. After the second active layer is conductive, the third constituent-active material part 7133 may form the channel region of the first transistor.

In an exemplary embodiment, performing the conducting treatment on the second active material layer by using the third conductive layer as the mask may further include other methods. For example, before the second dielectric layer 88 is formed, conducting ions may be implanted into the second active layer through an ion implantation process, and the ion implantation process may provide a certain initial energy to the conducting ions, so that the conducting ions may pass through the third gate insulating layer 87 and reach the second active layer. The conducting ions may be B, Al, F, In, Zn and other ions. In an exemplary embodiment, the conductivity of the second active material layer may be realized solely through the ion implantation process, or the degree of the conductivity of the second active material layer may be further improved through the ion implantation process on the basis of the above-mentioned vapor chemical deposition process of the second dielectric layer.

Figure 18:
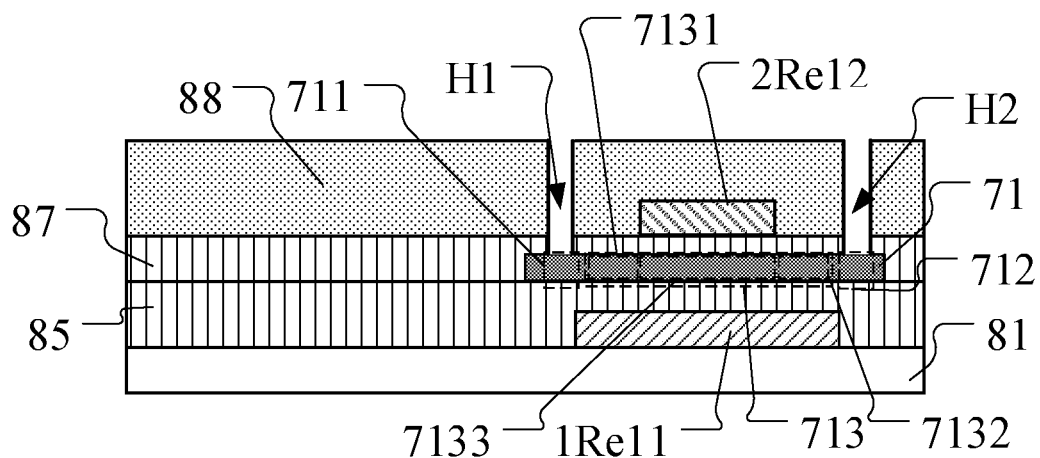
FIG. 18 is a process flow diagram of a method for manufacturing a display panel according to an exemplary embodiment of the present disclosure.

In an exemplary embodiment, FIG. 18 is a process flow chart of a method for manufacturing a display panel according to an exemplary embodiment of the present disclosure. The method for manufacturing the display panel may further include: forming a first via hole H1 and a second via hole H2 penetrating through the third gate insulating layer 87 and the second dielectric layer 88 by using dry etching gas. An orthographic projection of the first via hole H1 on the base substrate may be located on an orthographic projection of the first sub-active material part 711 on the base substrate, and an orthographic projection of the second via hole H2 on the base substrate may be located on an orthographic projection of the second sub-active material part 712 on the base substrate. The dry etching gas can generate the conducting ions during a dry etching process, and the conducting ions can realize the conductivity of the second active material layer, which can improve the degree of the conductivity of the first sub-active material part 711 and the second sub-active material part 712. For example, the dry etching gas may contain fluorine, hydrogen, etc., and the conducting ions may be fluorine ions, hydrogen ions. The conducting ions such as fluorine ions may occupy the gaps in the lattice of the indium gallium zinc oxide, which realizes the conductivity of the indium gallium zinc oxide. In addition, after the dry etching is completed, a further conducting treatment may be performed on the indium gallium zinc oxide layer by using argon gas Ar. Ar can also occupy the gaps in the lattice of the indium gallium zinc oxide, which realizes the conductivity of the indium gallium zinc oxide. Further, the inert gas Ar does not affect the characteristics of oxide transistors. Thus, the degree of the conductivity of the first sub-active material part 711 and the second sub-active material part 712 may be higher than that of the first constituent-active material part 7131 and the second constituent-active material part 7132. That is, the sheet resistance of the conducted first constituent-active material part 7131 is smaller than the sheet resistance of the conducted first sub-active material part 711, that is, the sheet resistance of the conducted first constituent-active material part 7131 is smaller than the sheet resistance of the conducted second sub-active material part 712. In addition, the sheet resistance of the conducted first constituent-active material part 7131 may be equal to the sheet resistance of the conducted second constituent-active material part 7132. The sheet resistance of the conducted first sub-active material part 711 may be equal to the sheet resistance of the second sub-active material part 712. The conducted first sub-active material part 711 may be used to form the first electrode of the first transistor, and the conducted second sub-active material part 712 may be used to form the second electrode of the first transistor. In an exemplary embodiment, the sheet resistance of the conducted first constituent-active material part may be 2000~20000 $\Omega/sq$, for example, 2000 $\Omega/sq$, 5000 $\Omega/sq$, 10000 $\Omega/sq$, and 20000 $\Omega/sq$. The sheet resistance of the conducted first sub-active material part may be 500-2000 $\Omega/sq$, for example, 500 $\Omega/sq$, 1000 $\Omega/sq$, 2000 $\Omega/sq$. The sheet resistance of the conducted second sub-active material part may be 500-2000 $\Omega/sq$, for example, 500 $\Omega/sq$, 1000 $\Omega/sq$, 2000 $\Omega/sq$.

It should be noted that, in the process of conducting the first sub-active material part 711 and the second sub-active material part 712 by using the conducting ions generated during the dry etching process with the dry etching gas, the conducting ions may diffuse laterally, so that the orthographic projection of the first via hole H1 on the base substrate may be slightly smaller than the orthographic projection of the first sub-active material part 711 on the base substrate, and the orthographic projection of the second via hole H2 on the base substrate may be slightly smaller than the orthographic projection of the second sub-active material part 712 on the base substrate.

In an exemplary embodiment, as shown in FIG. 17, the orthographic projection of the edge 7111 of the first sub-active part 711 on the base substrate may at least partially overlap with the orthographic projection of the first conductive part 1Re11 on the base substrate, and the orthographic projection of the edge 7121 of the second sub-active part 712 on the base substrate may at least partially overlap with the orthographic projection of the first conductive part 1Re11 on the base substrate. In other exemplary embodiments, the orthographic projection of the first conductive part 1Re11 on the base substrate may further at least partially overlap with the orthographic projection of the first via hole H1 on the base substrate, and the orthographic projection of the first conductive part 1Re11 on the base substrate may further at least partially overlap with the orthographic projection of the second via hole H2 on the base substrate.

It should be understood that, in an exemplary embodiment, the first transistor may also have other structures, for example, the first transistor may further include a plurality of channel regions connected in parallel or in series. Correspondingly, other embodiments can also utilize the above structure to increase the channel length of the first transistor.

Figure 19:
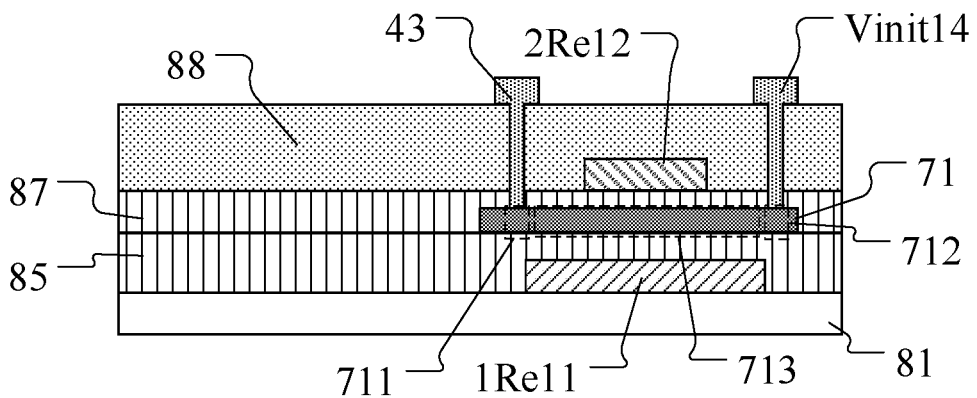
FIG. 19 is a process flow diagram of a method for manufacturing a display panel according to an exemplary embodiment of the present disclosure.

In an exemplary embodiment, FIG. 19 is a process flow chart of a method for manufacturing a display panel according to an exemplary embodiment of the present disclosure. The method for manufacturing the display panel may further include: forming a fourth conductive layer on a surface of the second dielectric layer 88 away from the base substrate 81. The fourth conductive layer may include a third conductive part 43 and a fourth conductive part Vinit14. The third conductive part 43 may be connected to the first sub-active material part 711 through the first via hole H1, and the fourth conductive part Vinit14 may be connected to the second sub-active material part 712 through the second via hole H2.

In an exemplary embodiment, the second transistor in FIG. 1 may also have the same structure as the first transistor in FIGS. 17-19.

An exemplary embodiment also provides a display panel, which can be manufactured by the above-mentioned method for manufacturing a display panel.

Figure 22:
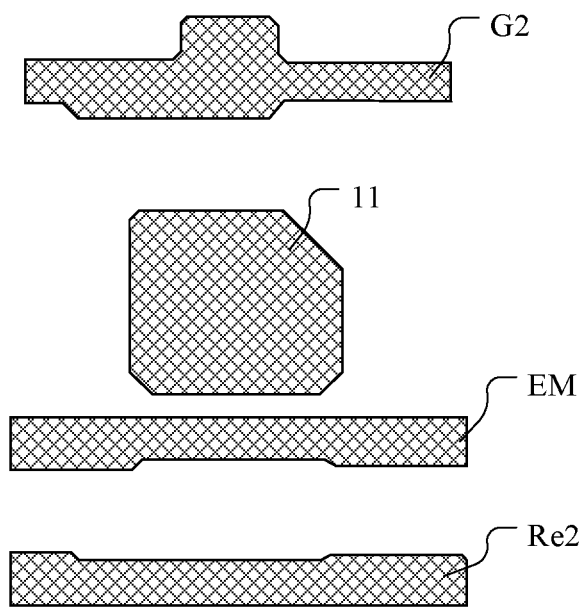
FIG. 22 is a structural layout of a first conductive layer in FIG. 20.
Figure 23:
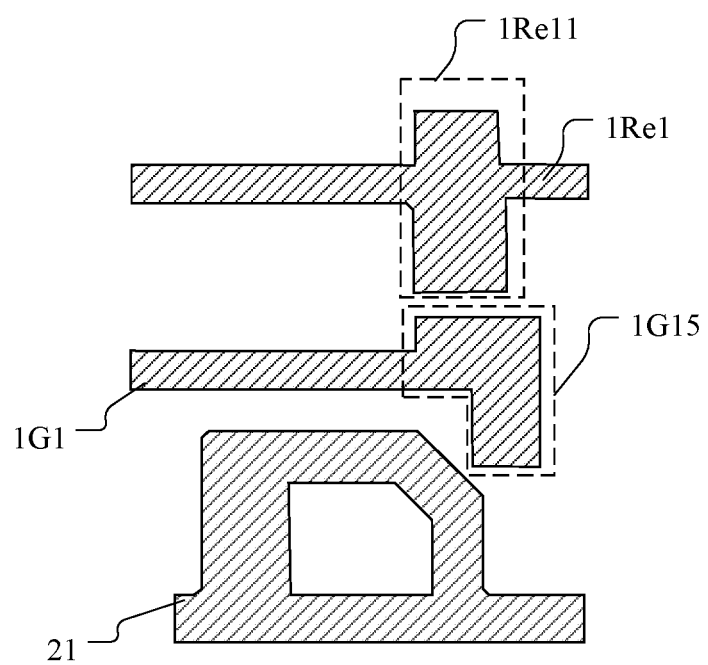
FIG. 23 is a structural layout of a second conductive layer in FIG. 20.
Figure 24:
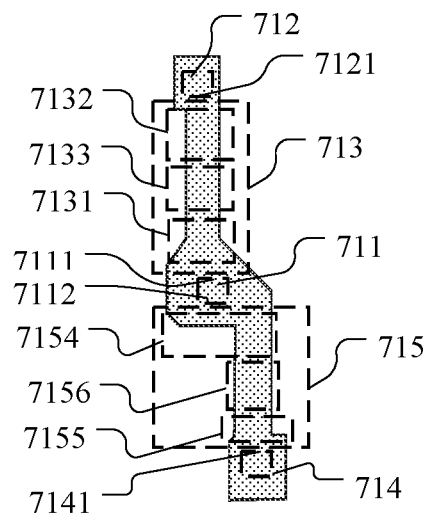
FIG. 24 is a structural layout of a second active layer in FIG. 20.
Figure 25:
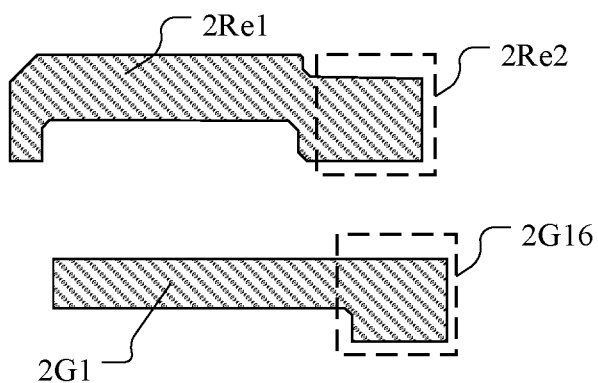
FIG. 25 is a structural layout of a third conductive layer in FIG. 20.
Figure 26:
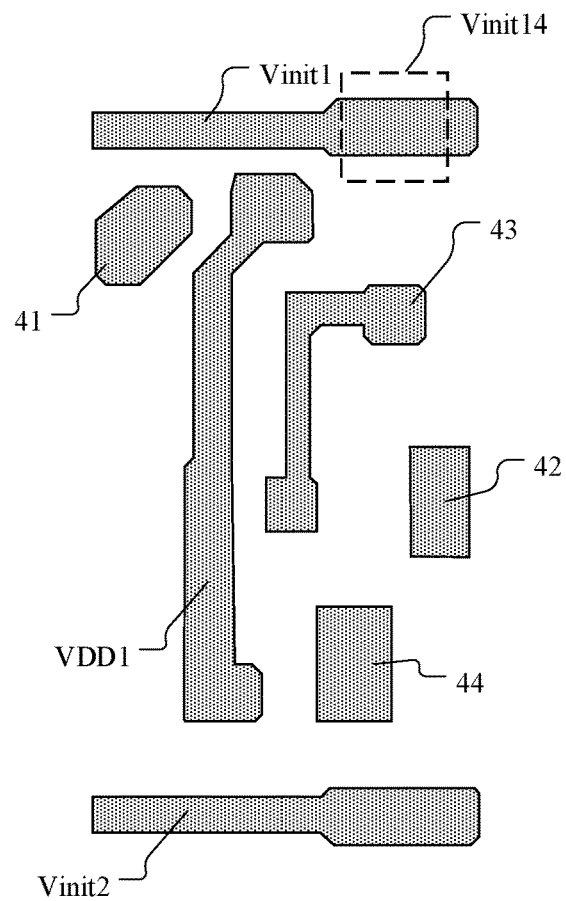
FIG. 26 is a structural layout of a fourth conductive layer in FIG. 20.
Figure 27:
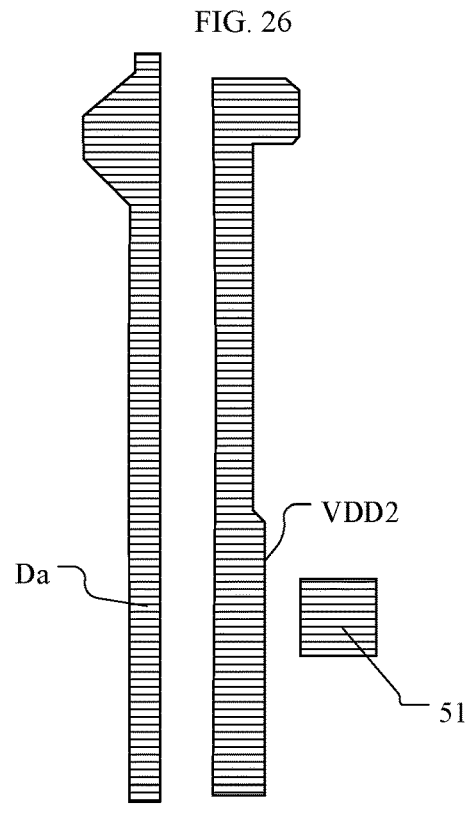
FIG. 27 is a structural layout of a fifth conductive layer in FIG. 20.
Figure 28:
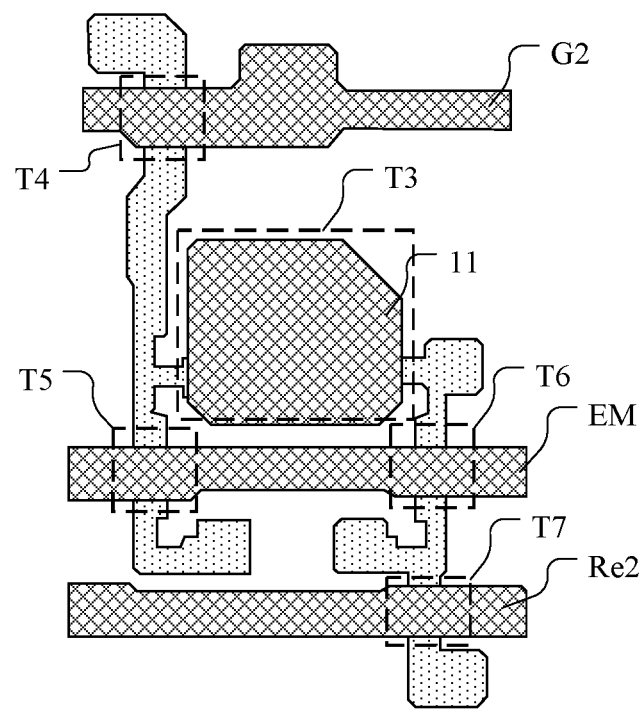
FIG. 28 is a structural layout of the first active layer and the first conductive layer in FIG. 20.
Figure 29:
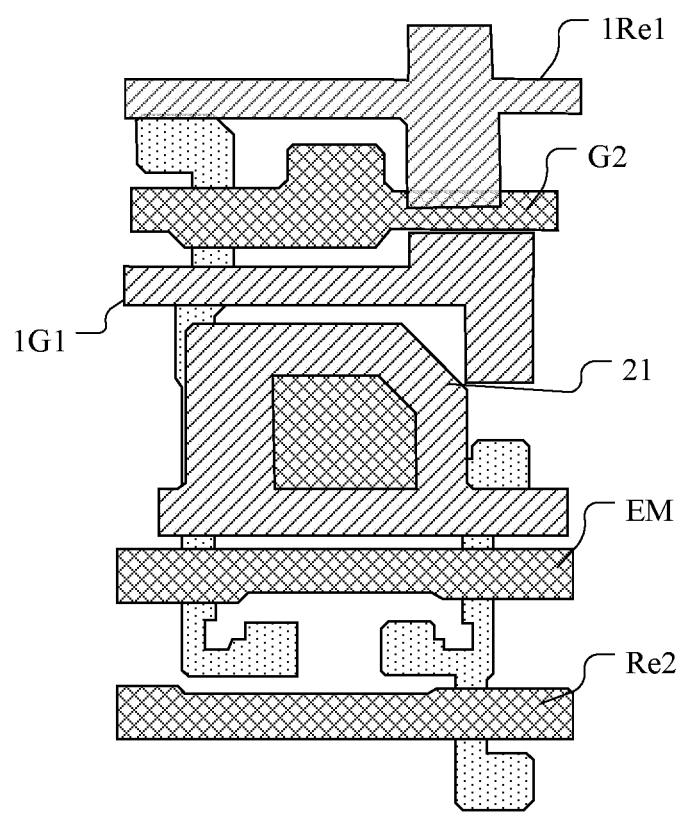
FIG. 29 is a structural layout of the first active layer, the first conductive layer, and the second conductive layer in FIG. 20.
Figure 30:
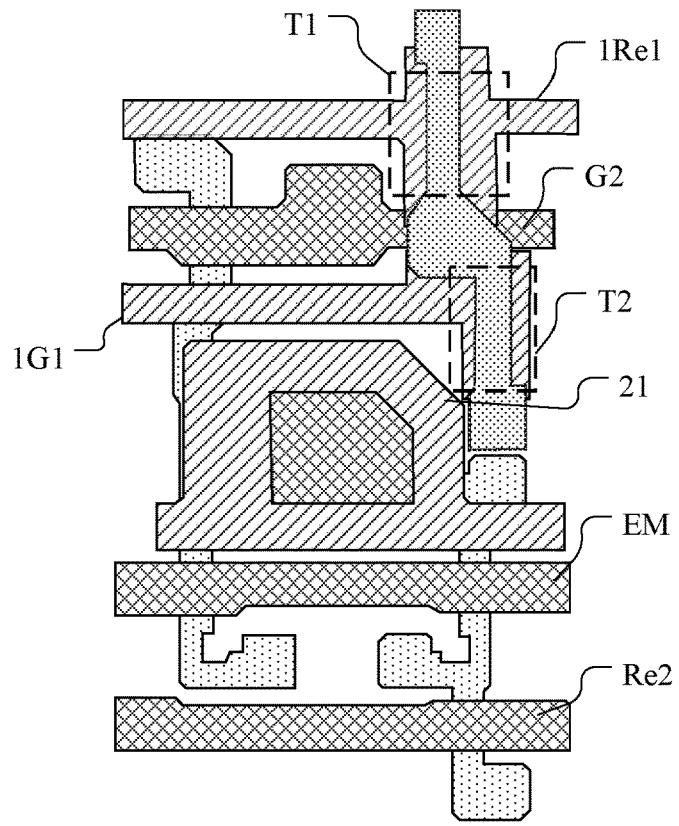
FIG. 30 is a structural layout of the first active layer, the first conductive layer, the second conductive layer, and the second active layer in FIG. 20.
Figure 31:
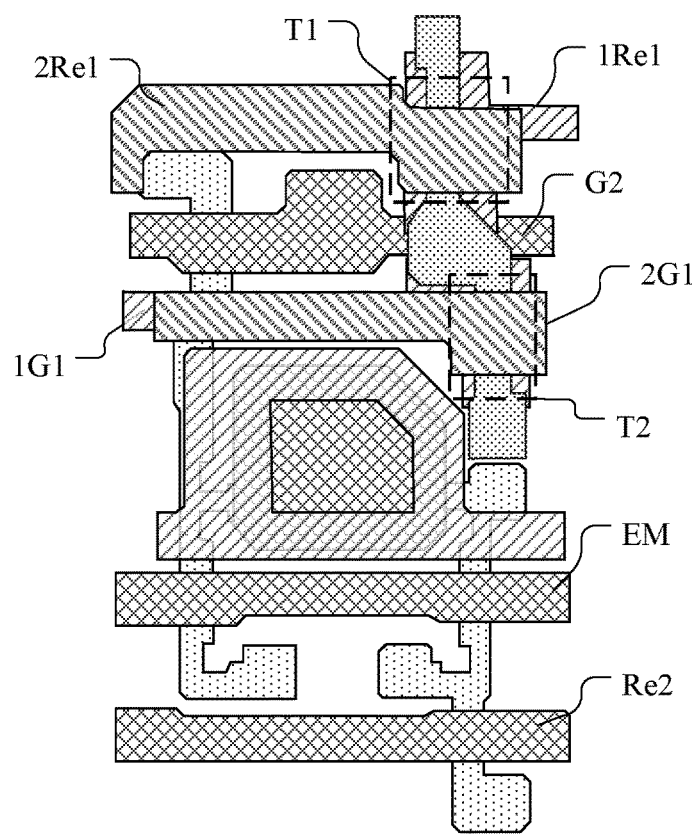
FIG. 31 is a structural layout of the first active layer, the first conductive layer, the second conductive layer, the second active layer, and the third conductive layer in FIG. 20.
Figure 32:
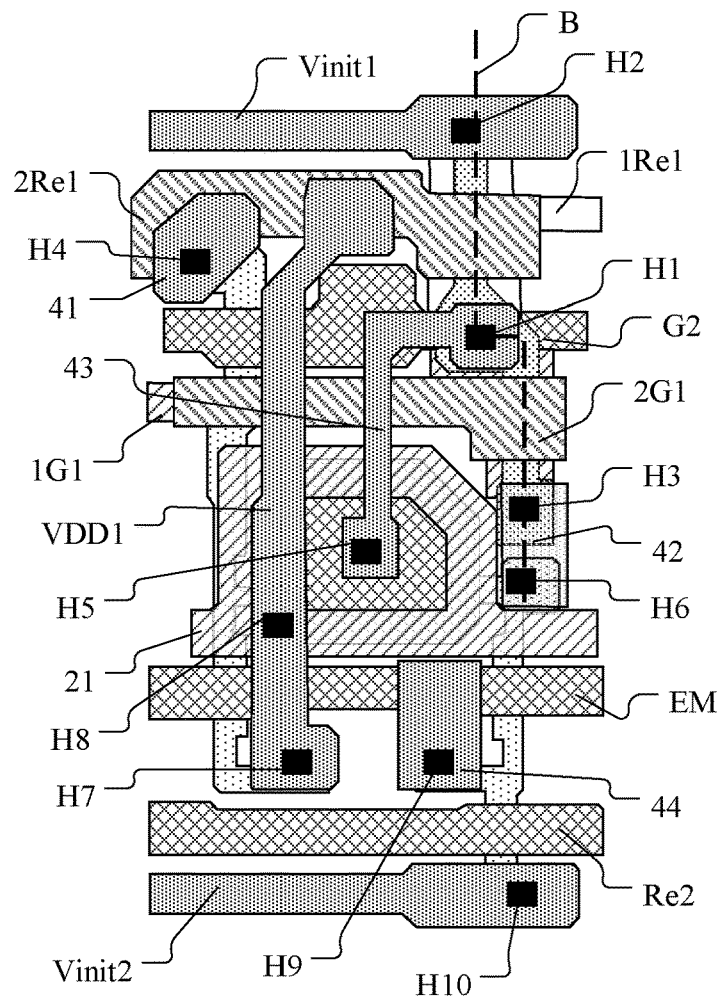
FIG. 32 is a structural layout of the first active layer, the first conductive layer, the second conductive layer, the second active layer, the third conductive layer, and the fourth conductive layer in FIG. 20.
Figure 33:
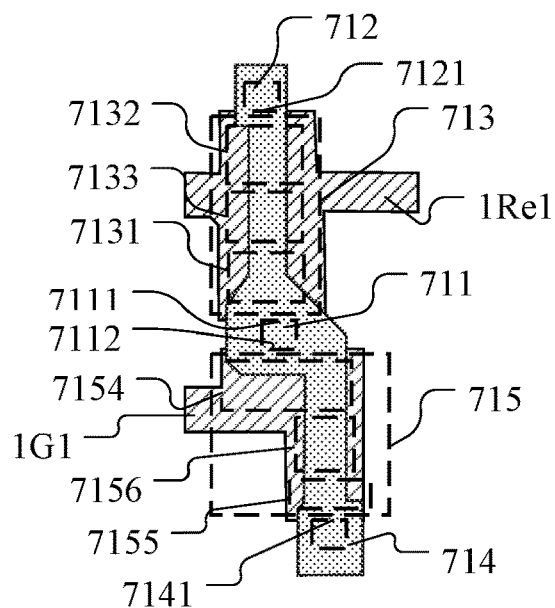
FIG. 33 is a partial structural layout of the second conductive layer and the second active layer in FIG. 20.
Figure 34:
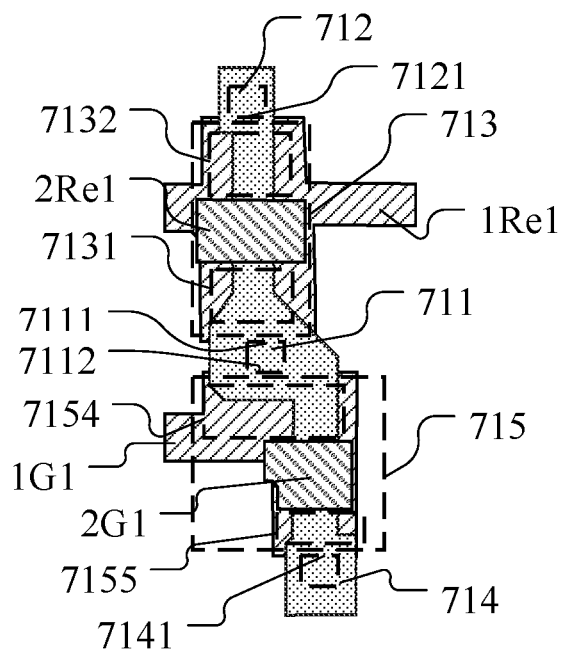
FIG. 34 is a partial structural layout of the second conductive layer, the second active layer, and the third conductive layer in FIG. 20.

In addition, the display panel may include the pixel driving circuit shown in FIG. 1, and the display panel may further include a first active layer, a first conductive layer, and a fifth conductive layer. The base substrate, the first active layer, the first conductive layer, the second conductive layer, the second active layer, the third conductive layer, the fourth conductive layer, and the fifth conductive layer may be stacked in sequence. As shown in FIGS. 20-32, FIG. 20 is a structural layout of a display panel according to an exemplary embodiment of the present disclosure; FIG. 21 is a structural layout of a first active layer in FIG. 20; FIG. 22 is a structural layout of a first conductive layer in FIG. 20; FIG. 23 is a structural layout of a second conductive layer in FIG. 20; FIG. 24 is a structural layout of a second active layer in FIG. 20; FIG. 25 is a structural layout of a third conductive layer in FIG. 20; FIG. 26 is a structural layout of a fourth conductive layer in FIG. 20; FIG. 27 is a structural layout of a fifth conductive layer in FIG. 20; FIG. 28 is a structural layout of the first active layer and the first conductive layer in FIG. 20; FIG. 29 is a structural layout of the first active layer, the first conductive layer, and the second conductive layer in FIG. 20; FIG. 30 is a structural layout of the first active layer, the first conductive layer, the second conductive layer, and the second active layer in FIG. 20; FIG. 31 is a structural layout of the first active layer, the first conductive layer, the second conductive layer, the second active layer, and the third conductive layer in FIG. 20; FIG. 32 is a structural layout of the first active layer, the first conductive layer, the second conductive layer, the second active layer, the third conductive layer, and the fourth conductive layer in FIG. 20; FIG. 33 is a partial structural layout of the second conductive layer and the second active layer in FIG. 20; and FIG. 34 is a partial structural layout of the second conductive layer, the second active layer, and the third conductive layer in FIG. 20.

Figure 20:
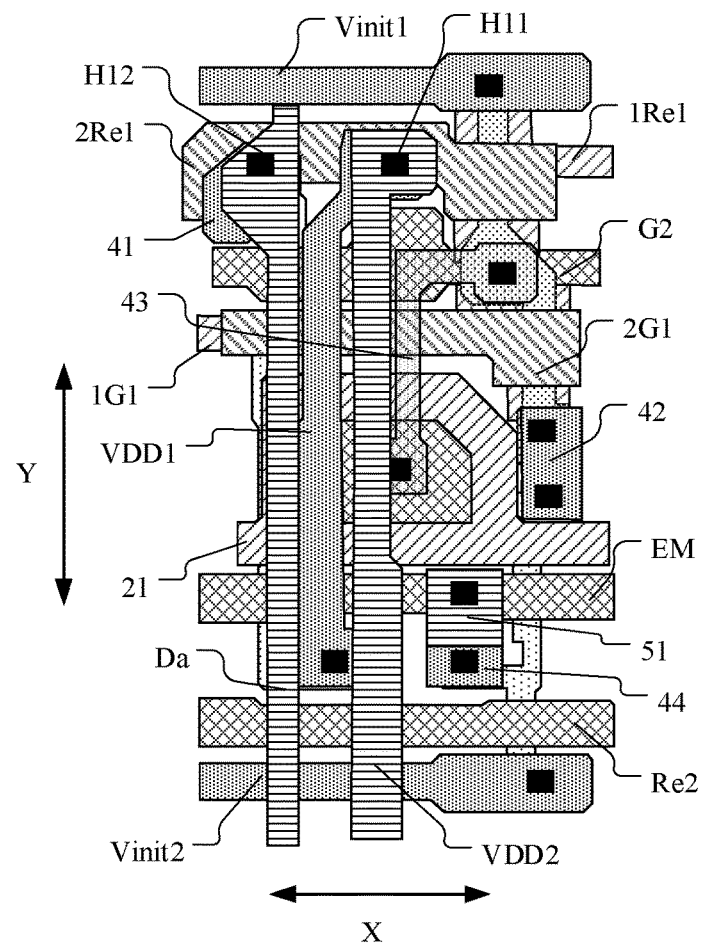
FIG. 20 is a structural layout of a display panel according to an exemplary embodiment of the present disclosure.
Figure 21:
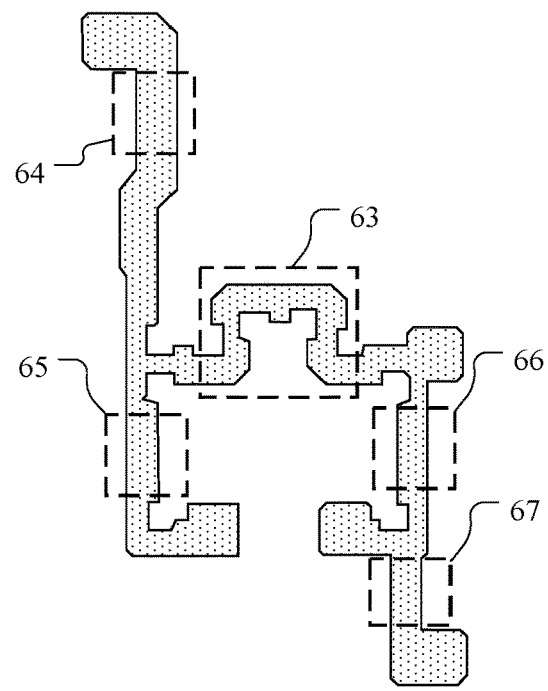
FIG. 21 is a structural layout of a first active layer in FIG. 20.

As shown in FIGS. 20, 21 and 28, the first active layer may include an active part 63, an active part 64, an active part 65, an active part 66, and an active part 67. The active part 64 is used to form the channel region of the fourth transistor, the active part 65 is used to form the channel region of the fifth transistor, the active part 66 is used to form the channel region of the sixth transistor, the active part 67 is used to form the channel region of the seventh transistor, and the active part 63 is used to form the channel region of the driving transistor T3. The first active layer may be formed of a polycrystalline silicon semiconductor.

As shown in FIGS. 20, 22, and 28, the first conductive layer may include a second gate driving signal line G2, an enable signal line EM, a second reset signal line Re2, and a conductive part 11. The second gate driving signal line G2 is used to provide the second gate driving signal terminal in FIG. 1, the enable signal line EM is used to provide the enable signal terminal in FIG. 1, and the second reset signal line Re2 is used to provide the second reset signal terminal in FIG. 1. The orthographic projection of the second gate driving signal line G2 on the base substrate, the orthographic projection of the enable signal line EM on the base substrate, and the orthographic projection of the second reset signal line Re2 on the base substrate may extend along a first direction X. The conductive part 11 is used to form the gate of the driving transistor T3 and an electrode of the capacitor C. The first active layer may be formed by performing a conducting treatment using the first conductive layer as a mask, that is, the part shielded by the first conductive layer forms the channel region of the transistor, and the part not shielded by the first conductive layer forms the conductor structure.

As shown in FIGS. 20, 23 and 29, the second conductive layer may include a first sub-reset signal line 1Re1, a first sub-gate driving signal line 1G1, and a conductive part 21. The first sub-reset signal line 1Re1 is used to provide the first reset signal terminal in FIG. 1, the first sub-gate driving signal line 1G1 is used to provide the first gate driving signal terminal in FIG. 1, and the conductive part 21 may form another electrode of the capacitor C. The first sub-reset signal line 1Re1 may include a first conductive part 1Re11, and the first conductive part 1Re11 may be used to form a first gate of the first transistor. The first sub-gate driving signal line 1G1 may include a fifth conductive part 1G15, and the fifth conductive part may be used to form a first gate of the second transistor T2. The orthographic projection of the first sub-reset signal line 1Re1 on the base substrate and the orthographic projection of the first sub-gate driving signal line 1G1 on the base substrate may extend along the first direction X.

As shown in FIGS. 20, 24, 30 and 33, the second active layer may include a first active part 71, and the orthographic projection of the first active part 71 on the base substrate may extend along a second direction Y. The second direction Y and the first direction X may cross each other, for example, the second direction Y and the first direction X may be perpendicular to each other. The first active part 71 may include a first sub-active part 711, a second sub-active part 712, and a third sub-active part 713 connected between the first sub-active part 711 and the second sub-active part 712. The first sub-active part 711 may be used to form the first electrode of the first transistor T1, the second sub-active part 712 may be used to form the second electrode of the first transistor T1, and a portion of the third sub-active part 713 may be used to form the channel region of the first transistor T1. The third sub-active part 713 may include a first constituent-active part 7131, a second constituent-active part 7132, and a third constituent-active part 7133. The first constituent-active part 7131 is connected between the first sub-active part 711 and the third constituent-active part 7133, the second constituent-active part 7132 is connected between the third constituent-active part 7133 and the second sub-active part 712, and the third constituent-active part 7133 may be used to form the channel region of the first transistor T1. The first active part 71 may further include a fourth sub-active part 714 and a fifth sub-active part 715, the fourth sub-active part 714 may be used to form the second electrode of the second transistor T2, the fifth sub-active part 715 may be connected between the fourth sub-active part 714 and the first sub-active part 711, and a portion of the fifth sub-active part 715 may be used to form the channel region of the second transistor T2. The fifth sub-active part 715 may include a fourth constituent-active part 7154, a fifth constituent-active part 7155, and a sixth constituent-active part 7156. The fourth constituent-active part 7154 may be connected between the first sub-active part 711 and the sixth constituent-active part 7156, the fifth constituent-active part 7155 may be connected between the sixth constituent-active part 7156 and the fourth sub-active part 714, and the sixth constituent-active part 7156 may be used to form the channel region of the second transistor T2. The orthographic projection of the second sub-active part 712 on the base substrate, the orthographic projection of the second constituent-active part 7132 on the base substrate, the orthographic projection of the third constituent-active part 7133 on the base substrate, the orthographic projection of the first constituent-active part 7131 on the base substrate, the orthographic projection of the first sub-active part 711 on the base substrate, the orthographic projection of the fourth constituent-active part 7154 on the base substrate, the orthographic projection of the sixth constituent-active part 7156 on the base substrate, the orthographic projection of the fifth constituent-active part 7155 on the base substrate and the orthographic projection of the fourth sub-active part 714 on the base substrate may be sequentially connected in the second direction Y. The second active layer may be formed of an oxide semiconductor such as indium gallium zinc oxide.

It should be noted that in view of process factors, there may be errors in the boundaries in the figures of the exemplary embodiment.

As shown in FIGS. 20, 25, 31 and 34, the third conductive layer may include a second sub-reset signal line 2Re1 and a second sub-gate driving signal line 2G1. The second sub-reset signal line 2Re1 is used to provide the first reset signal terminal in FIG. 1, and the second sub-gate driving signal line 2G1 is used to provide the first gate driving signal terminal in FIG. 1. The second sub-gate driving signal line 2G1 may include a sixth conductive part 2G16, and the sixth conductive part 2G16 may be used to form the second gate of the second transistor T2. The second sub-reset signal line 2Re1 may include a second conductive part 2Re2, and the second conductive part 2Re2 may be used to form the second electrode of the first transistor. The second sub-reset signal line 2Re1 and the first sub-reset signal line 1R1 may be connected through a via hole, and the second sub-gate driving signal line 2G1 and the first sub-gate driving signal line 1G1 may be connected through a via hole. It should be understood that, in other exemplary embodiments, the first gate and the second gate of the first transistor may be applied with different voltages respectively, and the first gate and the second gate of the second transistor may also be applied with different voltages respectively. The orthographic projection of the second sub-reset signal line 2Re1 on the base substrate and the orthographic projection of the second sub-gate driving signal line 2G1 on the base substrate may extend in the first direction. The second active layer may be formed by performing a conducting treatment using the third conductive layer as a mask, that is, the part shielded by the third conductive layer forms the channel region of the transistor, and the part not shielded by the third conductive layer forms the conductor structure. In addition, when conducting the second active layer with the third conductive part as the mask, the conducting ions will inevitably diffuse in the direction perpendicular to the stacking direction, therefore the size, in the second direction Y, of the orthographic projection of the second conductive part 2Re2 on the base substrate may be slightly larger than the size, in the second direction Y, of the orthographic projection of the third constituent-active part 7133 on the base substrate; and the size, in the second direction Y, of the orthographic projection of the sixth conductive part 2G16 on the base substrate may be slightly larger than the size, in the second direction Y, of the orthographic projection of the sixth constituent-active part 7156 on the base substrate.

As shown in FIGS. 20, 26 and 32, the fourth conductive layer may include a first power supply line VDD1, a first initial signal line Vinit1, a second initial signal line Vinit2, a conductive part 41, a third conductive part 43, and a conductive part 42, and a conductive part 44. The first power supply line VDD1 is used to provide the first power supply terminal in FIG. 1, the first initial signal line Vinit1 is used to provide the first initial signal terminal in FIG. 1, and the second initial signal line Vinit2 is used to provide the second initial signal terminal in FIG. 1. The conductive part 41 may be connected to the first active layer at the side of the active part 64 through the via hole H4 to connect to the first electrode of the fourth transistor. The third conductive part 43 may be connected to the conductive part 11 through the via hole H5 and connected to the first sub-active part 711 through the via hole H1, so as to connect the gate of the driving transistor and the first electrode of the first transistor, and to connect the gate of the driving transistor and the first electrode of the second transistor. The conductive part 42 may be connected to the first active layer at the side of the active part 66 through the via hole H6 and connected to the fourth sub-active part 714 through the via hole H3, so as to connect the first electrode of the sixth transistor and the first electrode of the second transistor. The conductive part 44 may be connected to the first active layer at the side of the active part 66 through the via hole H9 to connect to the second electrode of the sixth transistor. The first power supply line VDD1 may be connected to the first active layer at the side of the active part 65 through the via hole H7 to connect the first electrode of the fifth transistor and the first power supply terminal, and the first power supply line VDD1 may also be connected to the conductive part 21 through the via hole H8 to connect the capacitor C and the first power supply terminal. The first initial signal line Vinit1 may include a fourth conductive part Vinit14, and the fourth conductive part Vinit14 may be connected to the second sub-active part 712 through the via hole H2 to connect the second electrode of the first transistor and the first initial signal terminal. The second initial signal line Vinit2 may be connected to the first active layer at the side of the active part 67 through the via hole H10 to connect the second initial signal terminal and the second electrode of the seventh transistor.

It should be noted that the orthographic projection of the first via hole H1 on the base substrate may be slightly smaller than the orthographic projection of the first sub-active part 711 on the base substrate, and the orthographic projection of the second via hole H2 on the base substrate may be slightly smaller than the orthographic projection of the second sub-active part 712 on the base substrate. As shown in FIG. 24, the first sub-active part 711 may include an edge 7111 and an edge 7112 opposite in the second direction Y, the second sub-active part 712 may include an edge 7121 at the side close to the first sub-active part 711, and the fourth sub-active part 714 may include an edge 7141 at the side facing the first sub-active part 711. The orthographic projection of the edge 7111 on the base substrate may at least partially overlap with the orthographic projection of the first conductive part 1Re11 on the base substrate; the orthographic projection of the edge 7112 on the base substrate may at least partially overlap with the orthographic projection of the fifth conductive part 1G15 on the base substrate; the orthographic projection of the edge 7121 on the base substrate may at least partially overlap with the orthographic projection of the first conductive part 1Re11 on the base substrate; and the orthographic projection of the edge 7141 on the base substrate may at least partially overlap the orthographic projection of the fifth conductive part 1G15 on the base substrate. The orthographic projection of the first conductive part 1Re11 on the base substrate may also at least partially overlap with the orthographic projection of the first via hole H1 on the base substrate; and the orthographic projection of the first conductive part 1Re11 on the base substrate may also at least partially overlap with the orthographic projection of the second via hole H2 on the base substrate. In other exemplary embodiments, the orthographic projection of the fifth conductive part 1G15 on the base substrate may also at least partially overlap with the orthographic projection of the first via hole H1 on the base substrate, and the orthographic projection of the fifth conductive part 1G15 on the base substrate may also at least partially overlap with the orthographic projection of the second via hole H3 on the base substrate.

As shown in FIGS. 20 and 27, the fifth conductive layer may include a second power supply line VDD2, a data line Da, and a connection part 51. The second power supply line VDD2 is used to provide the first power supply terminal in FIG. 1, and the data line Da is used to provide the data signal terminal in FIG. 1. The second power supply line VDD2 may be connected to the first power supply line VDD1 through the via hole H11. The data line Da may be connected to the connection part 41 through the via hole H12 to connect the first electrode of the fourth transistor and the data signal terminal. The connection part 51 may be connected to the conductive part 44 through a via hole, and the connection part 51 may be used to connect to the anode of the light-emitting unit in FIG. 1. As shown in FIG. 20, the orthographic projection of the first power supply line VDD1 on the base substrate may be located between the orthographic projection of the data line Da on the base substrate and the orthographic projection of the conductive part 11 on the base substrate, and the first power supply line VDD1 may shield the interference from the data line Da on the conductive part 11.

Figure 35:
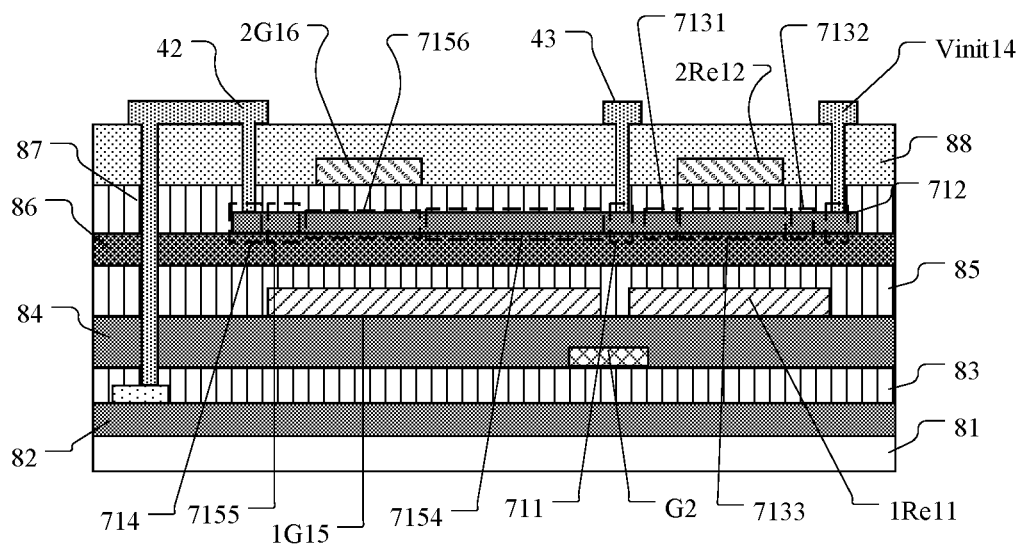
FIG. 35 is a partial cross-sectional view taken along a dotted line B in FIG. 32.

FIG. 35 is a partial cross-sectional view taken along the dotted line B in FIG. 32. The display panel may further include a first buffer layer 82, a first gate insulating layer 83, a second gate insulating layer 84, a first dielectric layer 85, a second buffer layer 86, a third gate insulating layer 87 and a second dielectric layer 88. The base substrate 81, the first buffer layer 82, the first active layer, the first gate insulating layer 83, the first conductive layer, the second gate insulating layer 84, the second conductive layer, the first dielectric layer 85, the second buffer layer 86, the second active layer, the third gate insulating layer 87, the third conductive layer, the second dielectric layer 88, and the fourth conductive layer are stacked in sequence. The first buffer layer and the second buffer layer may include at least one of a silicon oxide layer and a silicon nitride layer. The first gate insulating layer, the second gate insulating layer, and the third gate insulating layer may be silicon oxide layers. The first dielectric layer and the second dielectric layer may be silicon nitride layers. The materials of the fourth conductive layer and the fifth conductive layer may include metal materials, such as molybdenum, aluminum, copper, titanium or niobium or alloy thereof, or molybdenum/titanium alloy or stack, etc., or may be titanium/aluminum/titanium stack. The material of the first conductive layer, the second conductive layer, and the third conductive layer may be molybdenum, aluminum, copper, titanium or niobium, or alloy thereof, or molybdenum/titanium alloy or stack and the like. The base substrate 81 may include a glass substrate, a barrier layer, and a polyimide layer stacked in sequence, and the barrier layer may be an inorganic material.

In an exemplary embodiment, as shown in FIG. 35, the orthographic projection of the first conductive part 1Re11 on the base substrate may cover the orthographic projection of the third sub-active part 713 on the base substrate. The orthographic projection of the third gate insulating layer 87 on the base substrate may cover the orthographic projection of the first active part 71 on the base substrate. The orthographic projection of the second conductive part 2Re12 on the base substrate may cover the orthographic projection of the channel region (the third constituent-active part 7133) of the first transistor on the base substrate. The orthographic projection of the second conductive part on the base substrate is located between the orthographic projection of the first constituent-active part on the base substrate and the orthographic projection of the second constituent-active part on the base substrate, that is, the orthographic projection of the second conductive part 2Re12 on the base substrate and the orthographic projection of the first constituent-active part 7131 on the base substrate may not be overlapped with each other, and the orthographic projection of the second conductive part 2Re12 on the base substrate and the orthographic projection of the second constituent-active part 7132 on the base substrate may not be overlapped with each other.

When the conducting process is performed on the second active layer in the exemplary embodiment, since the second active layer is covered with the third gate insulating layer 87, the third gate insulating layer 87 can block the diffusion of the conducting ions, so that the diffusion amount of the conducting ions in the lateral direction is very small or even zero, and then the size, in the length direction (i.e., the second direction Y), of the channel region formed by using the second conductive part 2Re12 as the mask is the same or almost the same as the size of the second conductive part 2Re12 in the same direction. Therefore, the display panel may form the first transistor T1 with a larger-sized channel region under the action of the limited-sized second conductive part 2Re12. At the same time, since the third gate insulating layer 87 can block the diffusion of conducting ions, the ion doping concentrations of the first constituent-active part 7131 and the second constituent-active part 7132 not covered by the second conductive part 2Re12 are relatively low, and thus, the turn-on current of the first transistor T1 is small. In addition, in an exemplary embodiment, the orthographic projection of the first conductive part 1Re11 on the base substrate covers the orthographic projection of the third sub-active part 713 on the base substrate, and under the action of the turn-on voltage of the first conductive part 1Re11, the sheet resistances of the first constituent-active part 7131 and the second constituent-active part 7132 not covered by the second conductive part 2Re12 is reduced, so that the first transistor T1 may have a large turn-on current. In addition, since the first constituent-active part 7131 and the second constituent-active part 7132 not covered by the second conductive part 2Re12 have a large sheet resistance, the turn-off current of the first transistor is small.

In an exemplary embodiment, the sheet resistance of the first constituent-active part 7131 may be equal to the sheet resistance of the second constituent-active part 7132, the sheet resistance of the first constituent-active part 7131 may be smaller than the sheet resistance of the first sub-active part 711, and the sheet resistance of the first constituent-active part 7131 may be smaller than the sheet resistance of the second sub-active part 712. The sheet resistance of the first constituent-active part may be 2000~20000 Ω/sq, for example, 2000 Ω/sq, 5000 Ω/sq, 10000 Ω/sq, and 20000 Ω/sq. The sheet resistance of the first sub-active part may be 500~2000 Ω/sq, for example, 500 Ω/sq, 1000 Ω/sq, and 2000 Ω/sq. The sheet resistance of the second sub-active part may be 500~2000 Ω/sq, for example, 500 Ω/sq, 1000 Ω/sq, and 2000 Ω/sq. It should be understood that, due to process errors, the sheet resistance of the first constituent-active part 7131 may be slightly larger or smaller than the sheet resistance of the second constituent-active part 7132, and the difference between the sheet resistances of the first constituent-active part and the second constituent-active part is smaller than a preset value. The preset value may be 0-100 Ω/sq, for example, the preset value may be 0, 50, and 100.

In an exemplary embodiment, as shown in FIG. 35, the first sub-active part 711 may be shared as the first electrode of the second transistor T2. The orthographic projection of the fifth conductive part 1G15 on the base substrate may cover the orthographic projection of the fifth sub-active part 715 on the base substrate. The orthographic projection of the sixth conductive part 2G16 on the base substrate may cover the orthographic projection of the channel region (the sixth constituent-active part 7156) of the second transistor T2 on the base substrate. The orthographic projection of the sixth conductive part on the base substrate is located between the orthographic projection of the fifth constituent-active part on the base substrate and the orthographic projection of the fourth constituent-active part on the base substrate, that is, the orthographic projection of the sixth conductive part 2G16 on the base substrate does not overlap with the orthographic projection of the fifth constituent-active part 7155 on the base substrate, and the orthographic projection of the sixth conductive part 2G16 on the base substrate does not overlap with the orthographic projection of the fourth constituent-active part 7154 on the base substrate.

When the conducting process is performed on the second active layer in the exemplary embodiment, since the second active layer is covered with the third gate insulating layer 87, the third gate insulating layer 87 can block the diffusion of the conducting ions, so that the diffusion amount of the conducting ions in the lateral direction is very small or even zero, and then the size, in the length direction (i.e., the second direction Y), of the channel region formed by using the sixth conductive part 2G16 as the mask is the same or almost the same as the size of the sixth conductive part 2G16 in the same direction. Therefore, the display panel may form the second transistor T2 with a larger-sized channel region under the action of the limited-sized sixth conductive part 2G16. At the same time, since the third gate insulating layer 87 can block the diffusion of conducting ions, the ion doping concentrations of the fourth constituent-active part 7154 and the fifth constituent-active part 7155 not covered by the sixth conductive part 2G16 are relatively low, and thus, the turn-on current of the second transistor T2 is small. In addition, in an exemplary embodiment, the orthographic projection of the fifth conductive part 1G15 on the base substrate covers the orthographic projection of the fifth sub-active part 715 on the base substrate, and under the action of the turn-on voltage of the fifth conductive part, 1G15, the sheet resistances of the fourth constituent-active part 7154 and the fifth constituent-active part 7155 not covered by the sixth conductive part 2G16 is reduced, so that the second transistor T2 may have a large turn-on current. In addition, since the fourth constituent-active part 7154 and the fifth constituent-active part 7155 not covered by the sixth conductive part 2G16 have a large sheet resistance, the turn-off current of the second transistor T2 is small.

In an exemplary embodiment, the sheet resistance of the fourth constituent-active part 7154 may be equal to the sheet resistance of the fifth constituent-active part 7155, the sheet resistance of the fourth constituent-active part 7154 may be smaller than the sheet resistance of the fourth sub-active part 714, and the sheet resistance of the fourth constituent-active part 7154 may be smaller than the sheet resistance of the first sub-active part 711. The sheet resistance of the fourth constituent-active part 7154 is 2000~20000 Ω/sq, for example, 2000 Ω/sq, 5000 Ω/sq, 10000 Ω/sq, and 20000 Ω/sq. The sheet resistance of the fourth sub-active part 714 may be 500~2000 Ω/sq, for example, 500 Ω/sq, 1000 Ω/sq, and 2000 Ω/sq. It should be understood that, due to process errors, the sheet resistance of the fourth constituent-active part 7154 may be slightly larger or smaller than the sheet resistance of the fifth constituent-active part 7155. The difference between the sheet resistances of the fourth constituent-active part 7154 and the fifth constituent-active part 7155 is smaller than a preset value, and the preset value may be 0-100 Ω/sq, for example, the preset value may be 0, 50, and 100.

Figure 36:
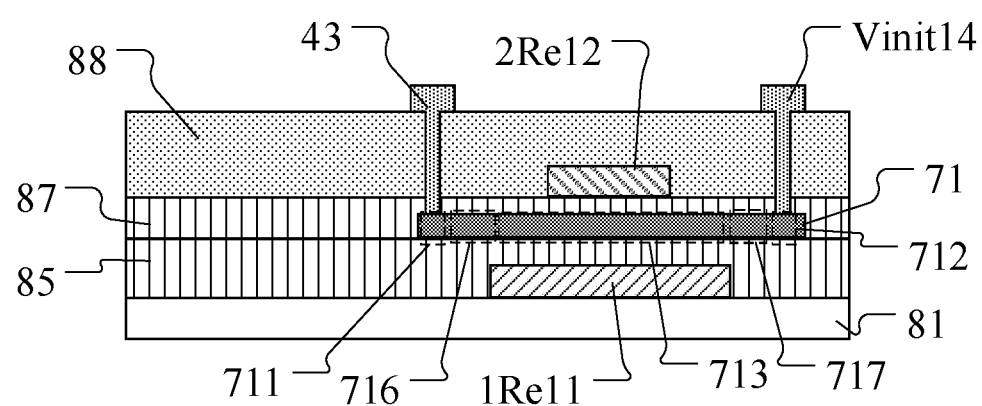
FIG. 36 is a schematic structural diagram of a first transistor of a display panel according to another exemplary embodiment of the present disclosure.

FIG. 36 is a schematic structural diagram of a first transistor of a display panel according to another exemplary embodiment of the present disclosure. Different from the structure of the first transistor in FIG. 35, the first active part may further include a sixth sub-active part 716, the sixth sub-active part 716 may be located between the first sub-active part 711 and the third sub-active part 713, and the orthographic projection of the sixth sub-active part 716 on the base substrate may be located between the orthographic projection of the first sub-active part 711 on the base substrate and the orthographic projections of the first conductive part 1Re11 on the base substrate, that is, the orthographic projection of the sixth sub-active part 716 on the base substrate and the orthographic projection of the first conductive part 1Re11 on the base substrate do not overlap with each other. The sheet resistance of the sixth sub-active part may be 2000~20000 Ω/sq. In addition, the first active part may further include a seventh sub-active part 717, the seventh sub-active part 717 may be located between the second sub-active part 712 and the third sub-active part 713, and the orthographic projection of the seventh sub-active part 717 on the base substrate may be located between the orthographic projection of the second sub-active part 712 on the base substrate and the orthographic projections of the first conductive part 1Re11 on the base substrate, that is, the orthographic projection of the seventh sub-active part 717 on the base substrate does not overlap with the orthographic projection of the first conductive part 1Re11 on the base substrate. The sheet resistance of the seventh sub-active part 717 may be 2000~20000 Ω/sq. In addition, in order to ensure that the first transistor has a large turn-on current, the dimensions of the sixth sub-active part 716 and the seventh sub-active part 717 in the length direction of the channel region of the first transistor cannot be too large. In an exemplary embodiment, the total length of the sixth sub-active part 716 and the seventh sub-active part 717 in the length direction of the channel region of the first transistor may be S1, the total length of the sixth sub-active part 716, the seventh sub-active part 717, the first sub-active part, and the second sub-active part in the length direction of the channel region of the first transistor may be S2, and S2/(S1+S2) may be greater than or equal to 80%. The length direction of the channel region of the first transistor is the conduction direction of the channel region of the first transistor. The second transistor in the display panel may have the same structure as the first transistor.

According to an aspect of the present disclosure, there is provided a display device, and the display device includes the above-mentioned display panel. The display device may be a display device of a mobile phone, a tablet computer, or a TV.

A person skilled in the art may easily conceive of other embodiments of the present disclosure after considering the specification and practicing the content disclosed herein. This application is intended to cover any variations, uses, or adaptations of the present disclosure that follow the general principle of the present disclosure and include the common knowledge or technical means in the art not disclosed by the present disclosure. The specification and examples are to be regarded as exemplary only, with the true scope and spirit of the present disclosure being indicated by the claims.

It can be understood that the present disclosure is not limited to the precise structure described above and illustrated in the accompanying drawings, and that various modifications and changes may be made without departing from the scope thereof. The scope of the present disclosure is limited only by the appended claims.

What is claimed is:

1. A display panel comprising a first transistor, wherein the display panel comprises:
 a base substrate;
 a conductive layer, located on a surface of the base substrate and comprising a first conductive part, the first conductive part being provided to form a first gate of the first transistor;
 an active layer, located on a surface of the conductive layer away from the base substrate and comprising a first active part, the first active part comprising a first sub-active part, a second sub-active part, and a third sub-active part connected between the first sub-active part and the second sub-active part, the first sub-active part being provided to form a first electrode of the first transistor, the second sub-active part being provided to form a second electrode of the first transistor, and a portion of the third sub-active part being provided to form a channel region of the first transistor, and an orthographic projection of the first conductive part on the base substrate covering an orthographic projection of the third sub-active part on the base substrate;

a gate insulating layer, located on a surface of the active layer away from the base substrate, an orthographic projection of the gate insulating layer on the base substrate covering an orthographic projection of the first active part on the base substrate; and an additional conductive layer, located on a surface of the gate insulating layer away from the base substrate and comprising a second conductive part, the second conductive part being provided to form a second gate of the first transistor, and an orthographic projection of the second conductive part on the base substrate covering an orthographic projection of the channel region of the first transistor on the base substrate, wherein the display panel further comprises a pixel driving circuit, and the pixel driving circuit comprises the first transistor;

the pixel driving circuit further comprises a driving transistor, the first electrode of the first transistor is connected to a gate of the driving transistor, and the second electrode of the first transistor is connected to a first initial signal terminal; and the pixel driving circuit further comprises a second transistor, a first electrode of the second transistor is connected to the gate of the driving transistor, a second electrode of the second transistor is connected to a second electrode of the driving transistor, and the second transistor is an oxide transistor, wherein the first active part further comprises:
a fourth sub-active part, provided to form the second electrode of the second transistor; and
a fifth sub-active part, connected between the fourth sub-active part and the first sub-active part, and a portion of the fifth sub-active part being provided to form a channel region of the second transistor;
the first sub-active part is further used as the first electrode of the second transistor;
the conductive layer further comprises a fifth conductive part, the fifth conductive part is provided to form a first gate of the second transistor, and an orthographic projection of the fifth conductive part on the base substrate covers an orthographic projection of the fifth sub-active part on the base substrate;
the additional conductive layer further comprises a sixth conductive part, the sixth conductive part is provided to form a second gate of the second transistor, and an orthographic projection of the sixth conductive part on the base substrate covers an orthographic projection of the channel region of the second transistor on the base substrate.

2. The display panel according to claim 1, wherein the third sub-active part comprises a first constituent-active part, a second constituent-active part, and a third constituent-active part, the first constituent-active part is connected between the first sub-active part and the third constituent-active part, the second constituent-active part is connected between the third constituent-active part and the second sub-active part, and the third constituent-active part is provided to form the channel region of the first transistor; and the orthographic projection of the second conductive part on the base substrate covers an orthographic projection of the third constituent-active part on the base substrate, and the orthographic projection of the second conductive part on the base substrate is located between an orthographic projection of the first constituent-active part on the base substrate and an orthographic projection of the second constituent-active part on the base substrate.

3. The display panel according to claim 2, wherein a difference between a sheet resistance of the first constituent-active part and a sheet resistance of the second constituent-active part is smaller than a predetermined value of 100 $\Omega/sq$, the sheet resistance of the first constituent-active part is smaller than a sheet resistance of the first sub-active part, and the sheet resistance of the first constituent-active part is smaller than a sheet resistance of the second sub-active part.

4. The display panel according to claim 2, wherein a difference between a sheet resistance of the first constituent-active part and a sheet resistance of the second constituent-active part is smaller than a predetermined value of 100 $\Omega/sq$, and the sheet resistance of the first constituent-active part is 2000-20000 $\Omega/sq$.

5. The display panel according to claim 1, wherein the display panel further comprises:
a further conductive layer, located on a surface of the additional conductive layer away from the base substrate, and the further conductive layer comprises a third conductive part and a fourth conductive part; and
the third conductive part is connected to the first sub-active part through a first via hole, and the fourth conductive part is connected to the second sub-active part through a second via hole.

6. The display panel according to claim 5, wherein an orthographic projection of the first via hole on the base substrate is located on an orthographic projection of the first sub-active part on the base substrate, and an orthographic projection of the second via hole on the base substrate is located on an orthographic projection of the second sub-active part on the base substrate;
an area of the orthographic projection of the first via hole on the base substrate is smaller than or equal to an area of the orthographic projection of the first sub-active part on the base substrate; and
an area of the orthographic projection of the second via hole on the base substrate is smaller than or equal to an area of the orthographic projection of the second sub-active part on the base substrate.

7. The display panel according to claim 1, wherein an orthographic projection of an edge of the first sub-active part on the base substrate at least partially overlaps with the orthographic projection of the first conductive part on the base substrate; and
an orthographic projection of an edge of the second sub-active part on the base substrate at least partially overlaps with the orthographic projection of the first conductive part on the base substrate.

8. The display panel according to claim 1, wherein the first active part further comprises:
a sixth sub-active part, located between the first sub-active part and the third sub-active part, an orthographic projection of the sixth sub-active part on the base substrate being located between an orthographic projection of the first sub-active part on the base substrate and the orthographic projection of the first conductive part on the base substrate; and a sheet resistance of the sixth sub-active part is 2000-20000 Ω/sq.

9. The display panel according to claim 1, wherein, the fifth sub-active part comprises a fourth constituent-active part, a fifth constituent-active part, and a sixth constituent-active part, and the fourth constituent-active part is connected between the first sub-active part and the sixth constituent-active part, the fifth constituent-active part is connected between the sixth constituent-active part and the fourth sub-active part, and the sixth constituent-active part is provided to form the channel region of the second transistor; and the orthographic projection of the sixth conductive part on the base substrate covers an orthographic projection of the sixth constituent-active part on the base substrate, and the orthographic projection of the sixth conductive part on the base substrate is located between an orthographic projection of the fifth constituent-active part on the base substrate and an orthographic projection of the fourth constituent-active part on the base substrate.

10. The display panel according to claim 9, wherein a difference between a sheet resistance of the fourth constituent-active part and a sheet resistance of the fifth constituent-active part is smaller than a predetermined value of 100 Ω/sq, the sheet resistance of the fourth constituent-active part is smaller than a sheet resistance of the fourth sub-active part, and the sheet resistance of the fourth constituent-active part is smaller than a sheet resistance of the first sub-active part.

11. The display panel according to claim 9, wherein a difference between a sheet resistance of the fourth constituent-active part and a sheet resistance of the fifth constituent-active part is smaller than a predetermined value of 100 Ω/sq, and the sheet resistance of the fourth constituent-active part is 2000-20000 Ω/sq.

* * * * *